United States Patent
Eisenhammer

(10) Patent No.: US 11,022,733 B2
(45) Date of Patent: Jun. 1, 2021

(54) ASI-H BANDPASS FILTER COMPRISING A SECOND MATERIAL WITH HIGH REFRACTIVE INDEX AND A SECOND BANDPASS FILTER AS A BLOCKER

(71) Applicant: Optics Balzers AG, Balzers (LI)

(72) Inventor: Thomas Eisenhammer, Azmoos (CH)

(73) Assignee: OPTICS BALZERS AG, Balzers (LI)

(*) Notice: Subject to any disclaimer, the term of this patent is extended or adjusted under 35 U.S.C. 154(b) by 0 days.

(21) Appl. No.: 16/614,871

(22) PCT Filed: Nov. 29, 2017

(86) PCT No.: PCT/EP2017/025348
§ 371 (c)(1),
(2) Date: Nov. 19, 2019

(87) PCT Pub. No.: WO2018/215044
PCT Pub. Date: Nov. 29, 2018

(65) Prior Publication Data
US 2020/0408977 A1    Dec. 31, 2020

(30) Foreign Application Priority Data

May 20, 2017    (DE) ...................... 10 2017 004 828.2

(51) Int. Cl.
G02B 5/28      (2006.01)
C23C 14/10    (2006.01)
C23C 14/35    (2006.01)

(52) U.S. Cl.
CPC .............. G02B 5/288 (2013.01); C23C 14/10 (2013.01); C23C 14/35 (2013.01); G02B 5/281 (2013.01)

(58) Field of Classification Search
CPC ......... C23C 14/10; C23C 14/35; G02B 5/281; G02B 5/285; G02B 5/289
(Continued)

(56) References Cited

U.S. PATENT DOCUMENTS 5,398,133 A    3/1995    Tsai
9,354,369 B2  5/2016    Hendrix
(Continued)

FOREIGN PATENT DOCUMENTS

DE    20 2017 100 512 U1    2/2017

OTHER PUBLICATIONS

International Search Report for PCT/EP2017/025348 dated Mar. 6, 2018.

*Primary Examiner* — Ryan S Dunning
(74) *Attorney, Agent, or Firm* — Pearne & Gordon LLP

(57) ABSTRACT

An optical filter having a substrate including a primary bandpass filter at least predominantly on an interference basis and a secondary bandpass filter at least predominantly on an interference basis. Both bandpass filters are designed such that they transmit sufficiently over the entire required angle range in the desired spectral transmittance wavelength interval. The primary bandpass filter contains the small angle shift required by the overall system. It also has a spectral transmittance wavelength interval which is as small as possible according to the requirements of the respective application and restricted by narrow blocking bands. The secondary bandpass filter is designed such that its transmittance wavelength interval is limited by a short-wave edge and a long-wave edge and is adjusted to the primary bandpass filter in such a way that its edges shift over the required angle range only within the blocking bands of the primary bandpass filter.

20 Claims, 20 Drawing Sheets

(58) Field of Classification Search
USPC .................. 359/359, 586, 588, 589, 590
See application file for complete search history.

(56) References Cited

U.S. PATENT DOCUMENTS

| | | |
|---|---|---|
| 2015/0253477 A1 | 9/2015 | Nakao |
| 2016/0238759 A1 | 8/2016 | Sprague |

Figure 4a

| | |
|---|---|
| aSi:H | 50.9 |
| aSiNx:H | 89.8 |
| aSi:H | 242.4 |
| aSiNx:H | 71.2 |
| aSi:H | 60.0 |
| aSiNx:H | 72.4 |
| aSi:H | 59.8 |
| aSiNx:H | 71.3 |
| aSi:H | 60.5 |
| aSiNx:H | 72.4 |
| aSi:H | 59.7 |
| aSiNx:H | 72.3 |
| aSi:H | 57.6 |
| aSiNx:H | 75.0 |
| aSi:H | 250.9 |
| aSiNx:H | 74.9 |
| aSi:H | 56.0 |
| aSiNx:H | 70.7 |
| aSi:H | 59.7 |
| aSiNx:H | 71.4 |
| aSi:H | 60.7 |
| aSiNx:H | 70.7 |
| aSi:H | 60.1 |
| aSiNx:H | 72.1 |
| aSi:H | 58.7 |
| aSiNx:H | 77.2 |
| aSi:H | 175.9 |
| aSiNx:H | 111.7 |
| aSi:H | 98.7 |

| aSi:H | 135.5 |
|---|---|
| SiO2 | 378.2 |
| aSi:H | 57.2 |
| SiO2 | 247.0 |
| aSi:H | 118.6 |
| SiO2 | 94.0 |
| aSi:H | 57.9 |
| SiO2 | 435.3 |
| aSi:H | 133.2 |
| SiO2 | 135.0 |
| aSi:H | 49.8 |
| SiO2 | 113.6 |
| aSi:H | 123.2 |
| SiO2 | 168.7 |
| aSi:H | 97.9 |
| SiO2 | 430.2 |
| aSi:H | 117.1 |
| SiO2 | 47.8 |

Figure 7

| aSi:H | 47.9 |
|---|---|
| aSiNx:H | 95.6 |
| aSi:H | 240.2 |
| aSiNx:H | 71.4 |
| aSi:H | 59.3 |
| aSiNx:H | 73.6 |
| aSi:H | 59.9 |
| aSiNx:H | 71.3 |
| aSi:H | 59.0 |
| aSiNx:H | 73.5 |
| aSi:H | 60.2 |
| aSiNx:H | 71.2 |
| aSi:H | 60.3 |
| aSiNx:H | 69.2 |
| aSi:H | 255.3 |
| aSiNx:H | 67.9 |
| aSi:H | 59.7 |
| aSiNx:H | 71.7 |
| aSi:H | 59.1 |
| aSiNx:H | 72.8 |
| aSi:H | 60.1 |
| aSiNx:H | 70.5 |
| aSi:H | 59.9 |
| aSiNx:H | 74.9 |
| aSi:H | 58.3 |
| aSiNx:H | 75.0 |
| aSi:H | 173.7 |
| aSiNx:H | 136.2 |
| aSi:H | 74.7 |
| SiO2 | 50.0 |

Figure 8b

| | |
|---|---:|
| aSi:H | 127.2 |
| aSiNx:H | 77.9 |
| aSi:H | 73.9 |
| aSiNx:H | 57.3 |
| aSi:H | 391.8 |
| aSiNx:H | 106.6 |
| aSi:H | 70.5 |
| aSiNx:H | 90.6 |
| aSi:H | 78.4 |
| aSiNx:H | 104.3 |
| aSi:H | 83.7 |
| aSiNx:H | 92.2 |
| aSi:H | 397.2 |
| aSiNx:H | 89.2 |
| aSi:H | 58.8 |
| aSiNx:H | 79.8 |
| aSi:H | 73.5 |
| aSiNx:H | 81.0 |
| aSi:H | 67.4 |
| aSiNx:H | 92.4 |
| aSi:H | 437.2 |
| aSiNx:H | 60.2 |
| aSi:H | 70.9 |
| aSiNx:H | 50.4 |
| aSi:H | 67.8 |
| aSiNx:H | 102.3 |
| aSi:H | 203.3 |
| aSiNx:H | 78.3 |
| aSi:H | 434.5 |
| aSiNx:H | 79.9 |
| aSi:H | 82.3 |
| aSiNx:H | 97.8 |
| SiO2 | 54.0 |

Figure 8d

| | |
|---|---:|
| aSi:H | 144.9 |
| SiO2 | 130.5 |
| aSi:H | 174.5 |
| SiO2 | 106.3 |
| aSi:H | 78.4 |
| SiO2 | 107.9 |
| aSi:H | 193.2 |
| SiO2 | 190.0 |
| aSi:H | 183.9 |
| SiO2 | 121.1 |
| aSi:H | 109.8 |
| SiO2 | 124.5 |
| aSi:H | 334.2 |
| SiO2 | 127.9 |
| aSi:H | 104.2 |
| SiO2 | 116.1 |
| aSi:H | 149.9 |
| SiO2 | 53.5 |
| aSi:H | 175.3 |
| SiO2 | 77.6 |
| aSi:H | 135.6 |
| SiO2 | 89.7 |
| aSi:H | 135.4 |
| SiO2 | 92.0 |
| aSi:H | 329.4 |
| SiO2 | 118.9 |
| aSi:H | 139.6 |
| SiO2 | 144.2 |
| aSi:H | 174.1 |
| SiO2 | 207.0 |
| aSi:H | 164.1 |
| SiO2 | 40.0 |

Figure 9a

| Nb2O5 | 26.2 | 174.5 |
|---|---|---|
| SiO2 | 120.1 | 183.0 |
| Nb2O5 | 439.2 | 78.4 |
| SiO2 | 120.2 | 182.2 |
| Nb2O5 | 92.7 | 470.2 |
| SiO2 | 123.9 | 153.5 |
| Nb2O5 | 61.1 | 180.7 |
| SiO2 | 95.8 | 123.2 |
| Nb2O5 | 73.7 | 195.6 |
| SiO2 | 133.0 | 125.4 |
| Nb2O5 | 85.0 | 67.0 |
| SiO2 | 140.9 | 127.7 |
| Nb2O5 | 405.4 | 106.7 |
| SiO2 | 161.9 | 123.5 |
| Nb2O5 | 103.0 | 431.1 |
| SiO2 | 111.4 | 63.1 |
| Nb2O5 | 82.4 | 219.3 |
| SiO2 | 94.2 | 53.4 |
| Nb2O5 | 62.3 | 62.4 |
| SiO2 | 142.0 | 147.4 |
| Nb2O5 | 87.0 | 83.6 |
| SiO2 | 134.7 | 97.0 |
| Nb2O5 | 429.7 | 208.9 |
| SiO2 | 105.5 | 121.5 |
| Nb2O5 | 137.8 | 418.3 |
| SiO2 | 183.2 | 102.7 |
| Nb2O5 | 120.1 | 44.5 |
| SiO2 | 157.9 | |

Figure 10a

| | |
|---|---|
| aSi:H | 50.9 |
| aSiNx:H | 89.8 |
| aSi:H | 242.4 |
| aSiNx:H | 71.2 |
| aSi:H | 60.0 |
| aSiNx:H | 72.4 |
| aSi:H | 59.8 |
| aSiNx:H | 71.3 |
| aSi:H | 60.5 |
| aSiNx:H | 72.4 |
| aSi:H | 59.7 |
| aSiNx:H | 72.3 |
| aSi:H | 57.6 |
| aSiNx:H | 75.0 |
| aSi:H | 250.9 |
| aSiNx:H | 74.9 |
| aSi:H | 56.0 |
| aSiNx:H | 70.7 |
| aSi:H | 59.7 |
| aSiNx:H | 71.4 |
| aSi:H | 60.7 |
| aSiNx:H | 70.7 |
| aSi:H | 60.1 |
| aSiNx:H | 72.1 |
| aSi:H | 58.7 |
| aSiNx:H | 77.2 |
| aSi:H | 175.9 |
| aSiNx:H | 111.7 |
| aSi:H | 98.7 |

Figure 11a

| | | | |
|---|---|---|---|
| aSi:H | 45.8 | SiO2 | 88.3 |
| aSiNx:H | 98.2 | aSi:H | 136.1 |
| aSi:H | 240.5 | SiO2 | 349.5 |
| aSiNx:H | 70.9 | aSi:H | 70.3 |
| aSi:H | 60.1 | SiO2 | 249.4 |
| aSiNx:H | 72.2 | aSi:H | 131.8 |
| aSi:H | 58.2 | SiO2 | 89.5 |
| aSiNx:H | 74.7 | aSi:H | 31.2 |
| aSi:H | 63.0 | SiO2 | 435.5 |
| aSiNx:H | 70.3 | aSi:H | 149.0 |
| aSi:H | 63.9 | SiO2 | 210.3 |
| aSiNx:H | 76.2 | aSi:H | 21.6 |
| aSi:H | 57.0 | SiO2 | 78.8 |
| aSiNx:H | 74.7 | aSi:H | 121.8 |
| aSi:H | 249.4 | SiO2 | 257.7 |
| aSiNx:H | 73.8 | aSi:H | 94.5 |
| aSi:H | 54.2 | SiO2 | 393.1 |
| aSiNx:H | 63.2 | aSi:H | 55.3 |
| aSi:H | 60.2 | SiO2 | 261.4 |
| aSiNx:H | 77.9 | aSi:H | 109.3 |
| aSi:H | 62.3 | SiO2 | 112.7 |
| aSiNx:H | 76.2 | aSi:H | 56.2 |
| aSi:H | 63.6 | SiO2 | 457.0 |
| aSiNx:H | 73.7 | aSi:H | 123.6 |
| aSi:H | 58.0 | SiO2 | 154.8 |
| aSiNx:H | 79.1 | aSi:H | 68.5 |
| aSi:H | 172.4 | SiO2 | 112.4 |
| aSiNx:H | 111.0 | aSi:H | 119.3 |
| aSi:H | 98.3 | SiO2 | 176.8 |
| | | aSi:H | 95.0 |
| | | SiO2 | 436.7 |
| | | aSi:H | 116.3 |
| | | SiO2 | 58.6 |

ASI-H BANDPASS FILTER COMPRISING A SECOND MATERIAL WITH HIGH REFRACTIVE INDEX AND A SECOND BANDPASS FILTER AS A BLOCKER

The present invention relates to optical filters with low angle shift. The dependent claims relate to different and preferred embodiments.

Multi-layer systems based on hydrogenous and largely amorphous silicon (aSi:H) have been state of the art for some time and are used together with low-refractive index materials such as $SiO_2$ or silicon nitride $Si_3N_4$ as optical filters in the near-infrared range. An example of a bandpass filter with high transmittance for a spectral range of approximately 800 nm-1000 nm, consisting of a long-pass filter for wavelengths greater than approximately 800 nm on the one side and a short-pass filter for wavelengths smaller than approximately 1000 nm on the other side of a transparent substrate, can be found in Tsai et al. U.S. Pat. No. 5,398,133. In this case the low-refractive index material is $Si_3N_4$ with a refractive index of approximately 1.78 in this spectral range. Further examples of bandpass filters with high transmittance in the spectral range above 800 nm can be found in Hendrix et al. U.S. Pat. No. 9,354,369. The bandpass filters presented there use $SiO_2$, typically with a refractive index of approximately 1.47 in this spectral range, as a low refractive index material. These filters are, for example, used in the field of distance measurement. In this respect, the surrounding area is illuminated in pulsed mode by an infrared emitter with a wavelength typically in the range of 850-950 nm. The radiation scattered back or reflected by objects is received by a sensor and the time delay between transmission and reception of the pulse is measured to determine the distance. In order to improve the signal-to-noise ratio of the sensor, the sensor is covered by a bandpass filter for the spectral range of the emitter, so that, as far as possible, only the radiation of the infrared source is detected by the sensor. Another application relates to infrared sensors in "light curtains", which are used as safety elements for system shutdown when the light curtain is interrupted.

Advantages of the aSi:H in this application are the high refractive index and the high absorption of the aSi:H for wavelengths below the bandpass filter transmission, which together allow simple filter designs. According to standard literature, the refractive index is n=4.13 at 827 nm, although this value is frequently not reached, for example because of impurities due to oxygen in particular, so that refractive indices at this wavelength are rather in the range of 3.4-3.9. Due to the high refractive index, the use of a corresponding low refractive index material in the filter layer system leads to a large refractive index jump, making it possible to realize simpler and thinner layer designs with fewer layers for forming the steep-edge transmittance wavelength interval compared to filter designs whose high refractive index material has a smaller refractive index (for example $Nb_2O_5$ with a refractive index of approximately 2.25-2.3 at 800 nm). In order to reflect radiation of all wavelengths and for a large angle range, a complex layer system must be used for material combinations without absorption to block a broad spectral range of typically 300-800 nm. In contrast, with sufficient material thickness and depending on the detailed material properties, aSi:H absorbs a large part of the radiation in the spectral range below approximately 700 nm and almost the complete radiation typically below 600 nm. As a result, fewer layers are necessary to create the blocking in this spectral range. In addition, this absorption-based blocking is essentially independent of the incidence angle of the radiation.

Furthermore, it is known that high refractive index materials allow for filters having spectral properties with only weak dependency on the incidence angle (for example Macleod, Thin Film Optical Filters, 3. Edition 2001, chapter 7.2.4 and in particular graph 7.2 on page 287), making thus simpler filter designs possible, as long as large incidence angle ranges are required. In examples of such filters, the low refractive index material is in most cases $SiO_2$. Hendrix et al., U.S. Pat. No. 9,354,369, report an angle shift of optimally 12.2 nm for the angle range of 0° to 30°.

Hendrix et al. U.S. Pat. No. 9,354,369 also report aSi:H with very low k<0.0005 in the spectral range above 800 nm. The bandpass filter was applied on the one glass side, whereas on the other side of the substrate, only an anti-reflection (AR) coating consisting of $SiO_2$ and $Ta_2O_5$ was applied. This AR coating has no blocking function, so that in the spectral range between approximately 600 nm and the spectral range of the bandpass filter (between 810 and 840 nm, depending on the design) the radiation is largely blocked by interference in the aSi:H/$SiO_2$ bandpass filter.

It is, however, desirable for many applications to further reduce the angle shift or to allow for very good transmittance for even greater angles than 30° or 40° within the spectral range of the bandpass filter with very good blocking of the radiation outside the spectral range of the bandpass filter. Bandpass filters are often constructed on the basis of Fabry-Perot filters, which are constructed of one or more arrangements consisting of cavities (also called spacers) arranged between mirror layers. In the sense of the present description any combination of mirror layers and spacers arranged between them is understood to mean a Fabry-Perot filter, no matter the way the mirrors are ultimately realized. The mirror layers are often realized on the basis of interference layers consisting of individual layers. The cavities are then thicker than the individual layers of the mirror layers between which they are arranged, see, for example, Macleod, Thin Film Optical Filters, 3. Edition 2001, chapter 7.2.4.

In the usual notation for describing filters, a high refractive index layer having the optical thickness of one quarter of the design wavelength is denoted by "H", and analogously, a low refractive index layer having the optical thickness of one quarter of the design wavelength is denoted by "L". Therefore, the simplest Fabry-Perot filter with a cavity consisting of the high refractive index material is substrate/HL-2H-LH, wherein the cavity has twice the thickness of the mirror layers. More complex designs with multiple and thicker cavities as well as more mirror layers are possible, e.g. substrate/HL-4H-LHLHLHLHLHL-4H-LH. Simple formulas for calculating the angle shift of such designs are given in Macleod. The filter is usually described by an "effective refractive index" n* and the angle shift of the bandpass filter having a center wavelength $\lambda_0$ can be estimated to be inversely proportional to the square of n* according to the following formula (1)

$$\Delta\lambda = \lambda_0\left(1 - \sqrt{1 - \frac{(\sin\varphi)^2}{n^{*2}}}\right) \approx \frac{1}{2}\lambda_0 \frac{(\sin\varphi)^2}{n^{*2}} \qquad (1)$$

In order to minimize the angle shift, n* must be maximized. It is known that the cavity must be made of the high refractive index material to minimize the angle shift. For the calculation of n* for high refractive index cavities it can be seen from the following formula (2)

$$n^* = n_H \left( \frac{m - (m-1)\left(\frac{n_L}{n_H}\right)}{(m-1) - (m-1)\left(\frac{n_L}{n_H}\right) + \left(\frac{n_H}{n_L}\right)} \right)^{\frac{1}{2}} \quad (2)$$

that the angle shift is reduced by maximizing the refractive indices of both the high and low refractive index materials and further increasing the "order" of the cavity (cavities), with the order m=1 being a thickness 2H, m=2 being a thickness 4H, m=3 being a thickness 6H and so on.

Formula 2 allows calculating the effective refractive index for certain filter assemblies. However, this formula sometimes cannot be used, for example, if a bandpass filter comprises cavities of different order. In this case, in the context of this description, the effective refractive index is understood to mean that index which, based on formula 1, results from the following formula 2a with an incidence angle of 30°, wherein $\Delta\lambda$ (30°) is preferably the measured one or, if it is not directly measurable, the angle shift determined by means of thin-film calculation programs, at an incidence angle of 30°:

$$n^* = \sqrt{\frac{\lambda_0}{2\Delta\lambda(30°)}} \sin(30°) \quad (2a)$$

The refractive index of the high refractive index material is limited by the availability of corresponding materials. aSi:H is well suited as a material for the high refractive index material for applications in the spectral range of approximately 800-1100 nm or even greater, but the refractive index is limited to approximately 3.6-3.9 for industrial production processes. The thickness of the cavity is limited by the accuracy of the production processes, in particular with regard to the uniformity of the layer thickness on the substrate surface, so that cavities with m=2 or m=3 at most are frequently used.

In order to further reduce the angle shift of a bandpass filter, only the refractive index of the low refractive index material can be increased. To give a simple example of such a filter having the structure substrate (n=1.5)/HL-4H-LHLHL-4H-LH, FIG. 1 shows the spectral profile of the transmittance calculated by the thin film calculation program Filmstar. The refractive index of the high refractive index material $n_H$ was chosen to be 3.65, the design wavelength is 860 nm. The refractive index of the low refractive index material $n_L$ was varied by using the values 1.5 (solid line), 2.0 (dashed line), 2.5 (dotted line), and 3.0 (dash-dotted line). Absorption and dispersion were neglected in this case. At $n_L$=1.5, a very good blocking of approximately 660 to 840 nm is reached, only by interference, since the materials have no absorption. It is clearly recognizable that with increasing $n_L$ the spectral blocking range becomes more and more narrow and the blocking gets worse and worse, which means that also in the blocking range the transmittance increases to almost 10%. Of course, the situation can slightly be improved by optimizing the design. With a high refractive index of the low refractive index material of, for example, $n_L$=3.0, the blocking range caused by interference, however, is always very limited, as shown in FIG. 2 by way of another much more complex example: Substrate (n=1.5)/HL-4H-LHLHLHLHLHL-4H-LHLHLHLHLHL-4H-LH. Only a narrow spectral range of approximately 60-80 nm around the bandpass filter is blocked by interference, which is not sufficient for the applications described above.

When using a combination of $n_H$=3.65 and $n_L$=3.0, the angle shift from 0° to 30° at a center wavelength of 860 nm is about 9 nm, which is an interesting, very small angle shift for the application. With these values and the use of the formulas (1) and (2) given above, n*=3.36 (at m=2) and thus the predicted angle shift is 9.5 nm, which is in good agreement with the calculation made by the thin-film calculation program.

The aim of the present invention is therefore to provide a bandpass filter which comprises, in a desired spectral transmittance wavelength interval which is somewhere between 300 nm and 1100 nm, a small angle shift, preferably at incidence angles φ between 0° and 20°, of less than 0.6%, particularly preferably less than 0.5% of the center wavelength of the bandpass filter and/or at incidence angles between 0° and 30° less than 1.2%, particularly preferably less than 1.0% of the center wavelength of the bandpass filter and/or at incidence angles between 0° and 50° less than 3.0%, particularly preferably less than 2.5% of the center wavelength of the bandpass filter, wherein a very good blocking of the radiation must be realized in the spectral range of 450 nm, preferably of 420 nm and particularly preferably from 300 nm to the short-wave side of the bandpass filter and a very good blocking of the radiation must be realized in the spectral range from the long-wave side of the bandpass filter to 1100 nm. The center wavelength is understood to mean the average of the wavelengths $\lambda_H^{50\%}$ and $\lambda_L^{50\%}$ on the short-wave and the long-wave side of the bandpass filter, in which the transmittance is equal to 50% at the incidence angle of 0°.

In the context of the present description, the transmittance wavelength interval or bandwidth of the bandpass filter BP is understood to mean the spectral range whose lower interval limit is determined by the following formula:

$$\lambda_L^{BP} = \lambda_L^{50\%} + 0.1(\lambda_H^{50\%} - \lambda_L^{50\%}),$$

and whose upper interval limit is determined by the following formula:

$$\lambda_H^{BP} = \lambda_H^{50\%} - 0.1(\lambda_H^{50\%} - \lambda_L^{50\%}),$$

wherein $\lambda_H^{50\%}$ and $\lambda_L^{50\%}$ are the upper (long-wave) and the lower (short-wave) wavelengths of the bandpass filter with a transmittance of 50% each.

According to the invention, this object is achieved by a substrate which comprises a primary bandpass filter at least predominantly on an interference basis and a secondary bandpass filter at least predominantly on an interference basis. Both bandpass filters are designed to transmit sufficiently in the desired spectral transmittance wavelength interval over the entire required angular range. However, the primary bandpass filter is characterized by the fact that it has the low angle shift required by the overall system. It also has a spectral transmittance wavelength interval which is as small as possible according to the requirements of the particular application. Such transmittance wavelength interval is limited by narrow blocking bands, namely a short-wave narrow blocking band and a long-wave narrow blocking band. The spectral function of the primary bandpass filter outside the wavelength interval formed by the narrow blocking bands and the desired spectral transmittance wavelength interval initially plays a minor role.

The secondary bandpass filter is designed in such a way that its transmittance wavelength interval is limited by a short-wave and a long-wave edge and is adjusted to the primary bandpass filter such that its short-wave edge shifts over the required angular range only within the short-wave narrow blocking band of the primary bandpass filter and its long-wave edge shifts over the required angular range only within the long-wave narrow blocking band of the primary bandpass filter. In addition, the secondary bandpass filter is designed to block efficiently in the required wavelength range below the short-wave narrow blocking band of the primary bandpass filter and to block efficiently in the required wavelength range above the long-wave narrow blocking band of the primary bandpass filter.

Thus, the secondary bandpass filter compensates for the blocking deficits of the primary bandpass filter below the short-wave narrow blocking band and above the long-wave blocking band, while the primary bandpass filter, due to its narrow blocking bands, makes the angle shift of the secondary bandpass filter appear optically ineffective to the overall system.

Thus, a relatively large angle shift can be permitted to the secondary bandpass filter and accordingly this can be constructed of an alternating layer system consisting of layers having a large difference in refractive index and thus over large wavelength ranges of efficient blocking.

Accordingly, the primary bandpass filter comprises preferably an alternating layer system of at least two layer materials with different refractive index ($n_{PL}$ for the low refractive index and $n_{PH}$ for the high refractive index). The primary bandpass filter has a primary effective refractive index $n_p^*$ according to the above mentioned formula (2), if applicable, otherwise according to formula (2a), which is so high that the angle shift up to the required angle $\varphi$ is as small as required for the appropriate application. For this purpose, it is necessary that the refractive indices of the materials used for the primary bandpass filter are both high at the center wavelength of the bandpass filter, at least above 2.5, preferably above 2.8, and particularly preferably above 3.0. As a result, the effective refractive index is large and accordingly the angle shift is small as required.

The secondary bandpass filter preferably comprises an alternating layer system composed of at least one layer material with a high refractive index $n_{SH}$ at the center wavelength and at least one further layer material with refractive index $n_{SL}$ at the center wavelength with $n_{SL} < 0.66\ n_{SH}$, ensuring the large difference in refractive index which is advantageous for the optimal formation of the blocking. Furthermore, it is of course necessary that materials with such refractive indices exist at all, which currently limits the realistic refractive indices to the range 1.35 to 4.1. As stated above, it is additionally necessary that the angle shift of the secondary bandpass filter does not become too large, so that the function of the two bandpass filters is maintained for all angles from 0° to $\varphi$. According to simple calculations based on the formulas (1) and (2) (or, if necessary, based on the formula (2a)) and under the condition that the angle shift of the secondary bandpass filter may not exceed the angle shift of the primary bandpass filter by more than 3% of the center wavelength, the following formula must apply for the effective refractive index of the secondary bandpass filter $n_S^*$:

$$n_p^* > n_s^* \geq \frac{n_p^* \sin\varphi}{\sqrt{(\sin\varphi)^2 + 0.06 n_p^{*2}}} \quad (3)$$

In this case, the interaction of both bandpass filters outside the desired spectral transmittance wavelength interval can be additionally used to advantage. For example, it may not even be necessary for the blocking effect of the primary bandpass filter within the narrow blocking bands to be very efficient, as the secondary bandpass filter in this range may well contribute to blocking. A transmittance of 30%, corresponding to a reflection of about 70% (with negligible or low absorption in the spectral range near the transmittance wavelength interval) may well allow acceptable properties of the overall system from both bandpass filters. On the other hand, it is possible, for example, that the primary bandpass filter in the range below approximately 650-700 nms contributes essentially to blocking, for example by absorption.

With reference to various examples of optical filters and materials, the invention will now be described in detail by means of the figures.

FIG. 4a shows the layer structure of a primary bandpass filter for an optical filter according to the invention.

FIG. 7 shows the layer structure of a primary bandpass filter which has been optimized for transmittance at approximately 860-900 nm.

FIG. 8b shows the layer structure of a primary bandpass filter with $n_{PL}$ from FIG. 8a, which has been optimized for transmittance at approximately 930-970 nm.

FIG. 8d shows the layer structure of a secondary bandpass filter with $n_{SH}$ from FIG. 8c which has been optimized for transmittance at approximately 930-990 nm.

FIG. 9a shows the layer structure of a secondary bandpass filter which has been optimized for transmittance at approximately 855-925 nm.

FIG. 10a shows the layer structure of an example of a primary bandpass filter with reduced bandwidth which has been optimized for transmittance at approximately 865-890 nm.

FIG. 11a shows the layer structure of an example of a primary bandpass filter in combination with a secondary bandpass filter, which are all located on one side of the substrate.

Figure 1:
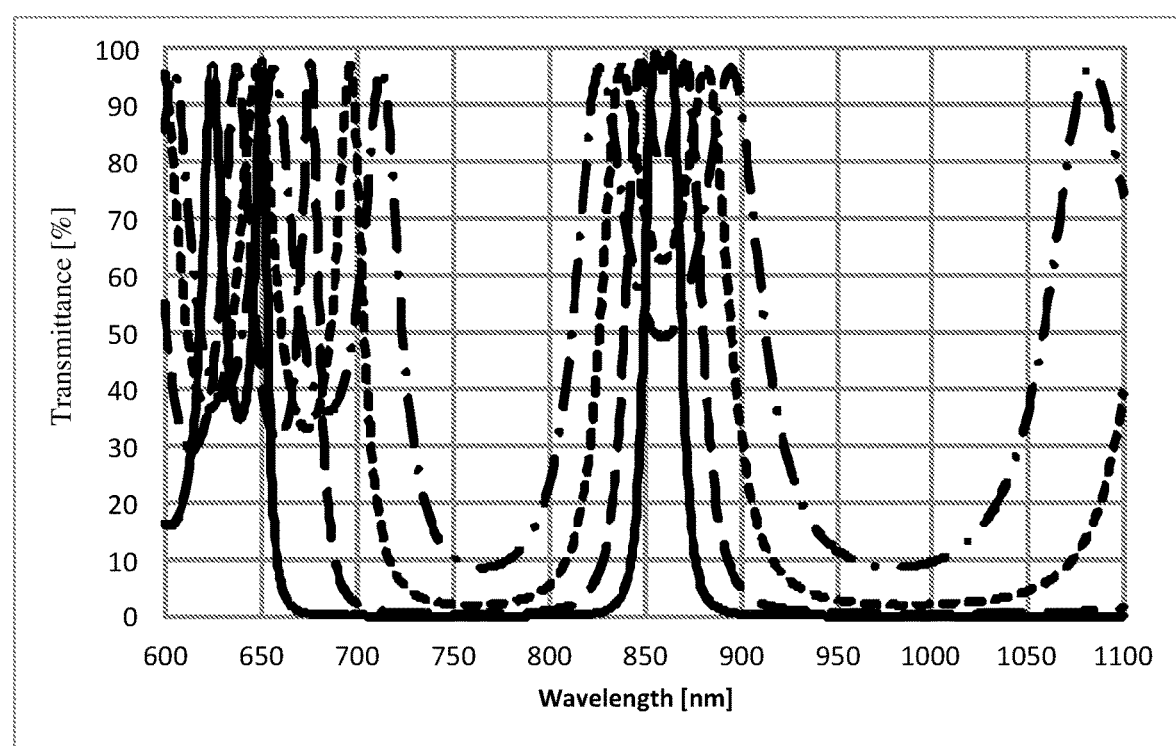
FIG. 1 shows the spectral transmittance of a filter for different low refractive index materials.

All of the examples discussed in the following are calculated for simplicity with unpolarized electromagnetic radiation. It would be easy for the person skilled in the art to transmit this on radiation polarized in any way.

When mentioning an alternating layer system with alternating layers in the present description, this means an alternating layer system of high refractive index layers and low refractive index layers, wherein the alternating layers do not have to follow each other directly, but, under certain circumstances, other layers may be provided between the alternating layers.

It is of particular advantage that both bandpass filters can be realized with the same material as a high refractive index material. Both bandpass filters can be realized, for example, with aSi:H as a high refractive index material. As regards the low refractive index material of the secondary bandpass filter, conventional materials such as $SiO_2$ or $Si_3N_4$ can be used.

In contrast, the low refractive index material in the primary bandpass filter, is particularly preferably realized also on the basis of aSi:H, wherein the refractive index is reduced by admixing optionally nitrogen atoms, oxygen atoms or carbon atoms. These materials have been frequently examined and the refractive index of the mixed material can be continuously varied between the refractive index of aSi:H and the refractive indices of stoichiometric $Si_3N_4$, $SiO_2$ or SiC. For example, it is known that a refractive index of ≈3 can be achieved for $aSiN_x$:H with a nitrogen content x of approximately 0.1 to 0.4, with the nitrogen content of this refractive index becoming smaller the more hydrogen is added. As the nitrogen content increases, the absorption is also shifted to smaller wavelengths, knowing that the absorption can be shifted to smaller wavelengths by increasing the hydrogen pressure in the deposition of aSi:H. This ensures that a low refractive index material with a refractive index of $n_{PL} \leq 2.5$ and sufficiently small absorption for the spectral range of the transmittance of the bandpass filter can be produced.

This can be achieved, for example, by the following method: The sputter coating system used in the examples is a drum system. The substrates are mounted on a drum with the side to be coated to the outside. The drum rotates with a rotation frequency of approximately 0.5 Hz, so that the substrates pass the targets every 2 s. The sputtering targets are located at a distance of 5 to 10 cm to the substrates and are rectangular, depending on the system design about 12 cm wide and about 50 cm long or more. The sputter sources are of the magnetron type. For sputtering aSi:H either a pulsed DC source is used or, if 2 targets are used to sputter aSi:H, also a mid-frequency power supply (typically 40 kHz) where the voltage is alternately applied to the two targets. As a sputtering gas for aSi:H, a gas mixture of argon and hydrogen is used in a ratio of typically 4:1, wherein the hydrogen content can also be chosen significantly lower and significantly higher (in the range 15:1 to 1.5:1), depending on the required spectral position of the transmittance wavelength interval of the optical filter. When using 2 targets, the total flow of gases is about 150-250 sccm in the example, producing a sputtering pressure in the vicinity of the target surface of about 5 to $15 \times 10^{-3}$ mbar. The sputtering voltage is typically in the range of 700-800V with a sputtering power of typically 4.5 kW per target. The average deposition rate is around 0.25 nm/s. For a refractive index of $n_L \geq 2.5$ in the deposition of $aSiN_x$:H, a relatively low nitrogen content x of approximately 0.05 to 0.45 is required, since a high hydrogen content was chosen for sufficiently low absorption. For this purpose, the argon flow is typically reduced in the range of 3-45% and replaced by a nitrogen flow in approximately the corresponding amount. At the same time, it has proven to be advantageous in some cases to increase the hydrogen flow significantly (by a factor of 1.5-3). This increased hydrogen flow reduces the absorption, in particular in the spectral range of 800 nm to 1100 nm, which is relevant for the transmittance. If the hydrogen flow is high, the amount of the nitrogen flow needed to reduce the refractive index is reduced.

Thanks to this type of system a large-area deposition, even for large substrates with a diameter of, for example, 300 mm, is possible. In order to improve homogeneity, a phase modulation of the sputtering power as described in U.S. Pat. No. 6,572,738 can be used.

Without heating the substrates, the energy input during the coating results in a substrate temperature of approximately 80-90° C., measured with a minimum maximum thermometer with drag pins. The temperature can be increased by additionally heating the substrates. For the present examples, a substrate temperature of approximately 170° C. has been used and it is also possible to deposit at lower or higher temperature. If necessary, the layer system can be cured by subsequent tempering at temperatures up to approximately 300° C., thereby reducing the absorption in the transmittance wavelength interval.

Figure 3A:
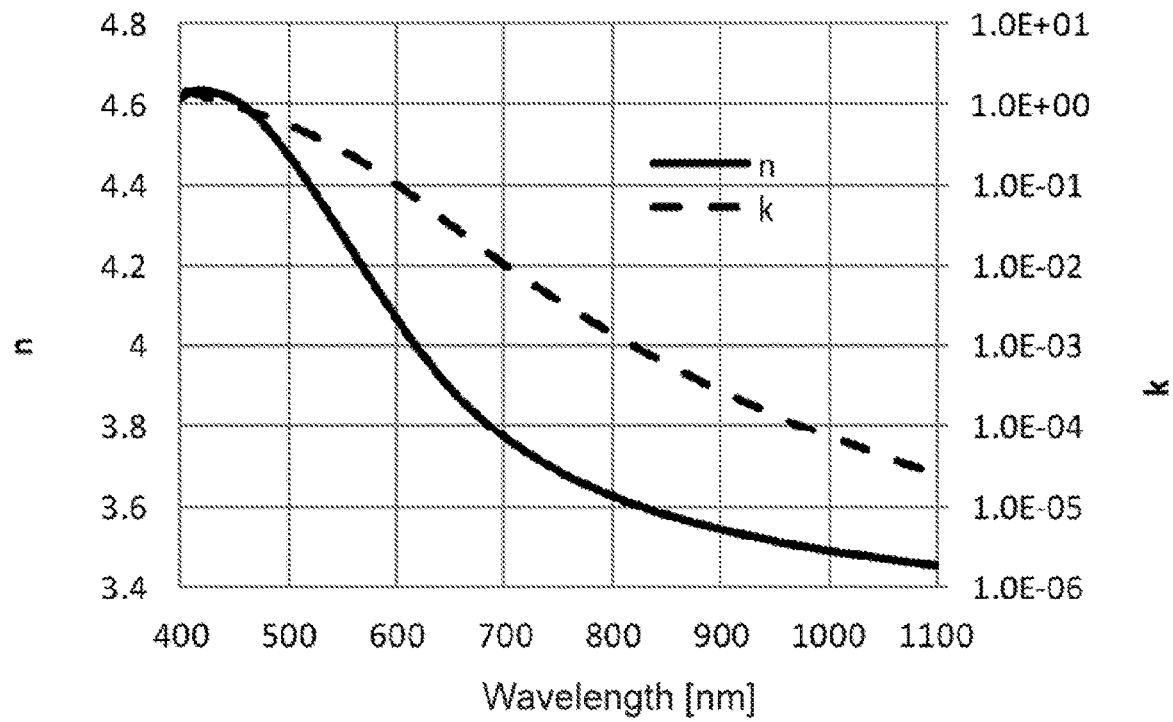
FIG. 3a shows the real part (n) and the imaginary part (k) of the complex refractive index of an aSi:H material produced according to a method.
Figure 3B:
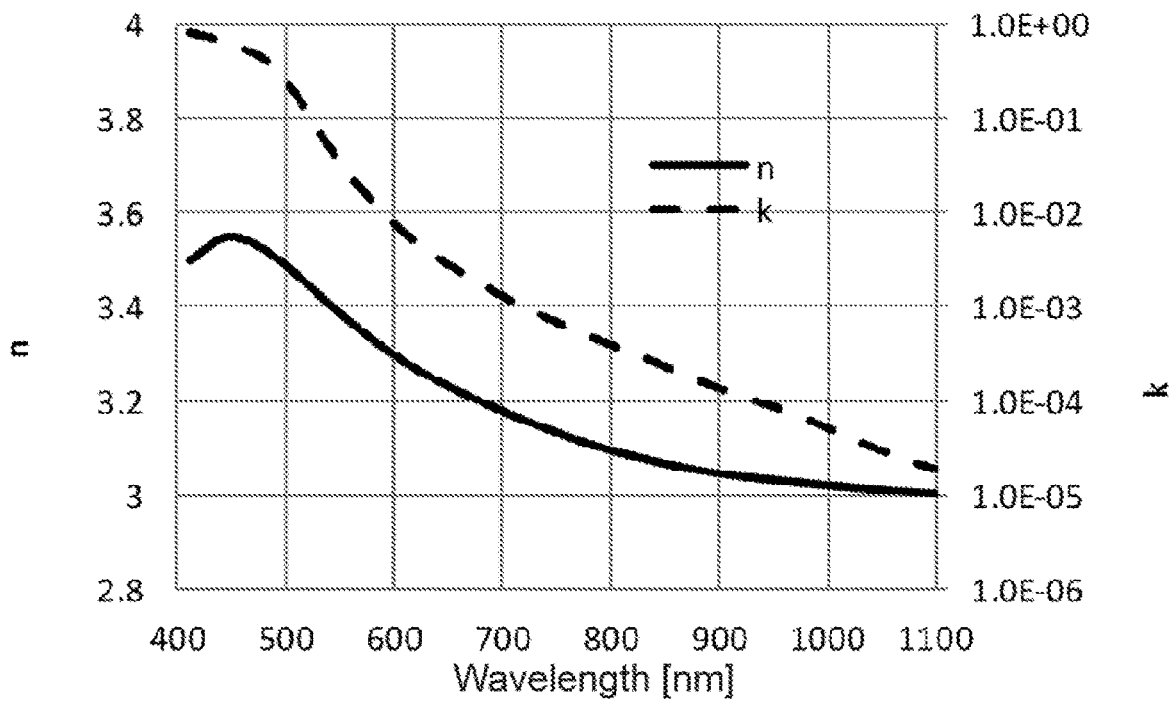
FIG. 3b shows the real part (n) and the imaginary part (k) of the complex refractive index of an aSiN$_x$:H material produced according to a further method.

FIG. 3a the shows real part (n) and the imaginary part (k) of the complex refractive index of the aSi:H material in a coating according to the method described above at a substrate temperature of approximately 170° C. and with a gas mixture consisting of argon and hydrogen with a ratio of 4:1 and a total flow of 150 sccm. The imaginary part of the material is above 0.01 at wavelengths below approximately 700 nm and below 0.001 at wavelengths above 800 nm. FIG. 3b shows the real part (n) and the imaginary part (k) of the complex refractive index of the aSiN$_x$:H material in a coating according to the method described above at a substrate temperature of 170° C. and with a gas mixture consisting of argon, nitrogen and hydrogen with a ratio of 0.5:0.06:0.44 and a total flow of 200 sccm. The high hydrogen flow is required to produce a material that has very low absorption, in particular in the relevant spectral range from 800 nm to 1100 nm, whereby tempering can be dispensed with.

Figure 2:
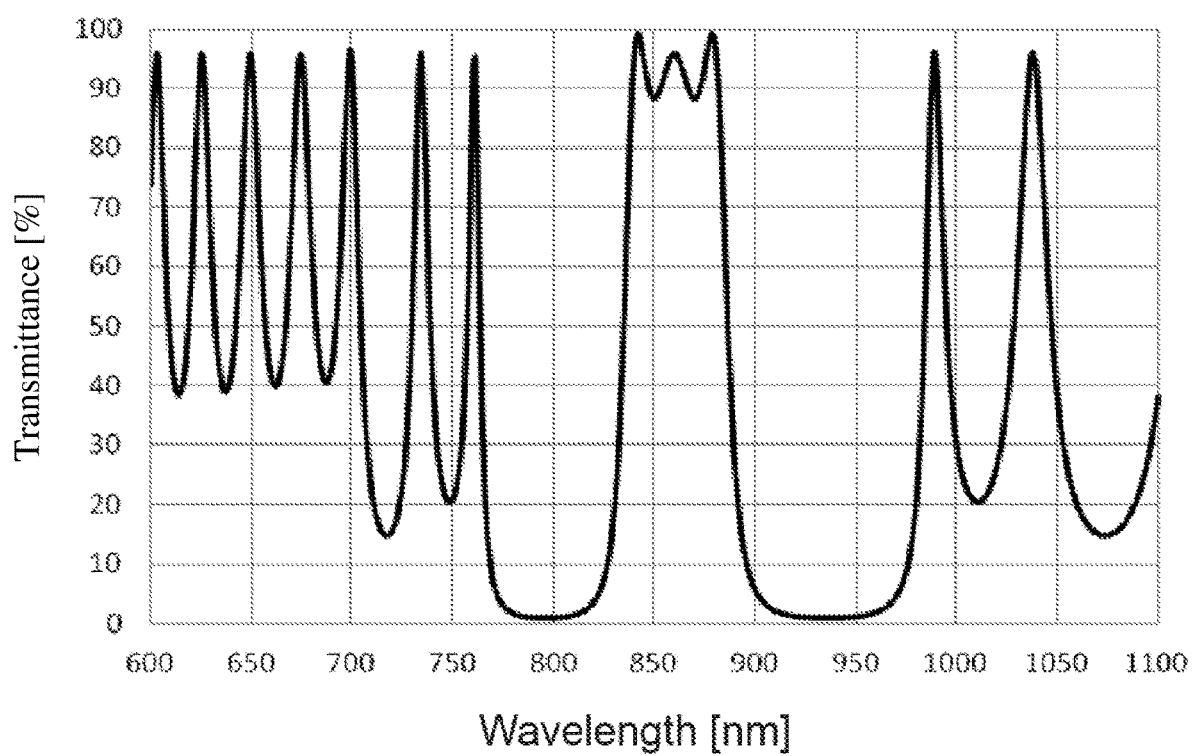
FIG. 2 shows the spectral transmittance of a filter with "low refractive index" material having a relatively high refractive index.
Figure 4B:
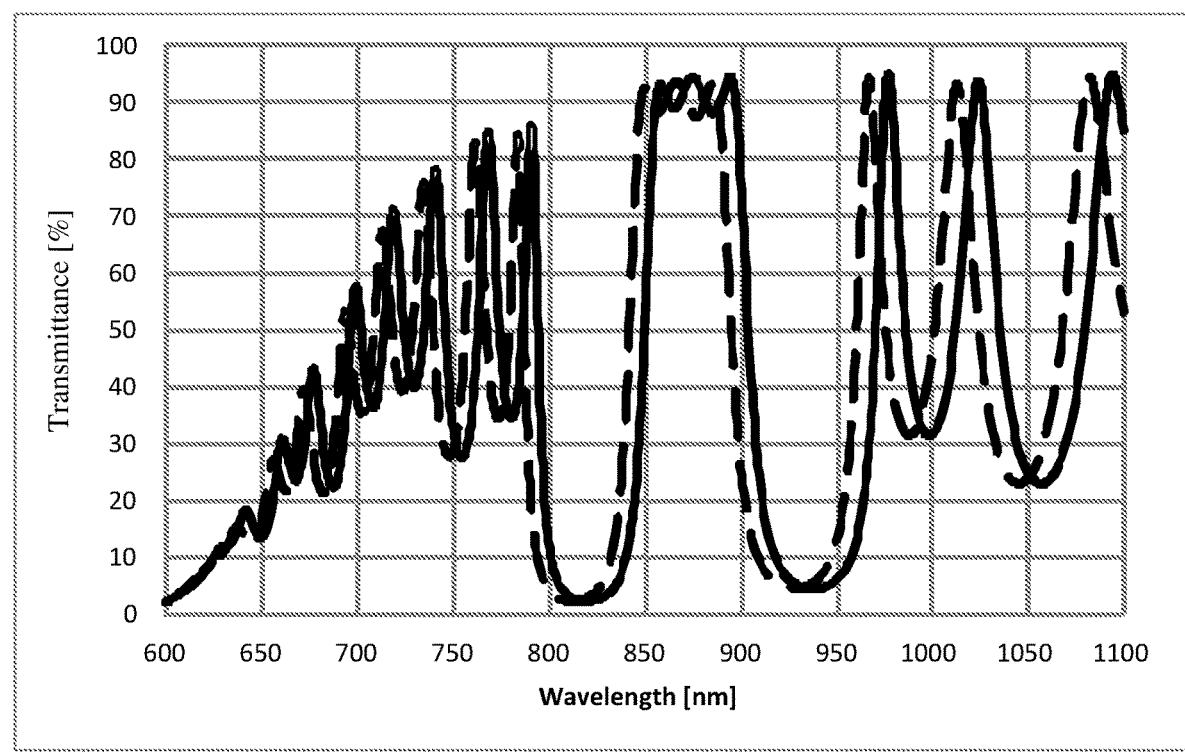
FIG. 4b shows the transmittance of the primary bandpass filter according to FIG. 4a to glass and without an antireflection coating on the rear side of the glass at incidence angles of 0° (solid line) and 30° (dashed line).

FIG. 4a shows the layer structure of a primary bandpass filter made of the two materials from FIGS. 3a and 3b, which has been optimized for transmittance at approximately 860-900 nm. The basic structure is comparable to the theoretical design of FIG. 2, wherein the layer thicknesses of the individual layers were re-optimized with Filmstar. The first layer is located on the substrate and the layer thicknesses are indicated in nanometres. The total layer thickness is about 2480 nm. FIG. 4b shows the transmittance of the primary bandpass filter without anti-reflection coating on the rear side of the glass at incidence angles of 0° (solid line) and 30° (dashed line). The angle shift, defined here as the averaged difference between the short-wave and long-wave 50% points for the two angles, is 8.5 nm. For wavelengths shorter than about 600 nm, the transmittance is almost completely suppressed by absorption in aSi:H. The blocking is insufficient for all other wavelength ranges and only relevant for a spectral range of about 40 nm left and right of the bandpass filter. Considering the formulas (1) and (2) given above and the refractive indices $n_{PH}$=3.56 and $n_{PL}$=3.05 at the center wavelength of 880 nm, $n_p^*$ is 3.33 (with m=2) and hence the angle shift up to 30° is 1.1% of the center wavelength or 9.7 nm, which is in good agreement with the above value of 8.5 nm.

Figures 5A, 5B:
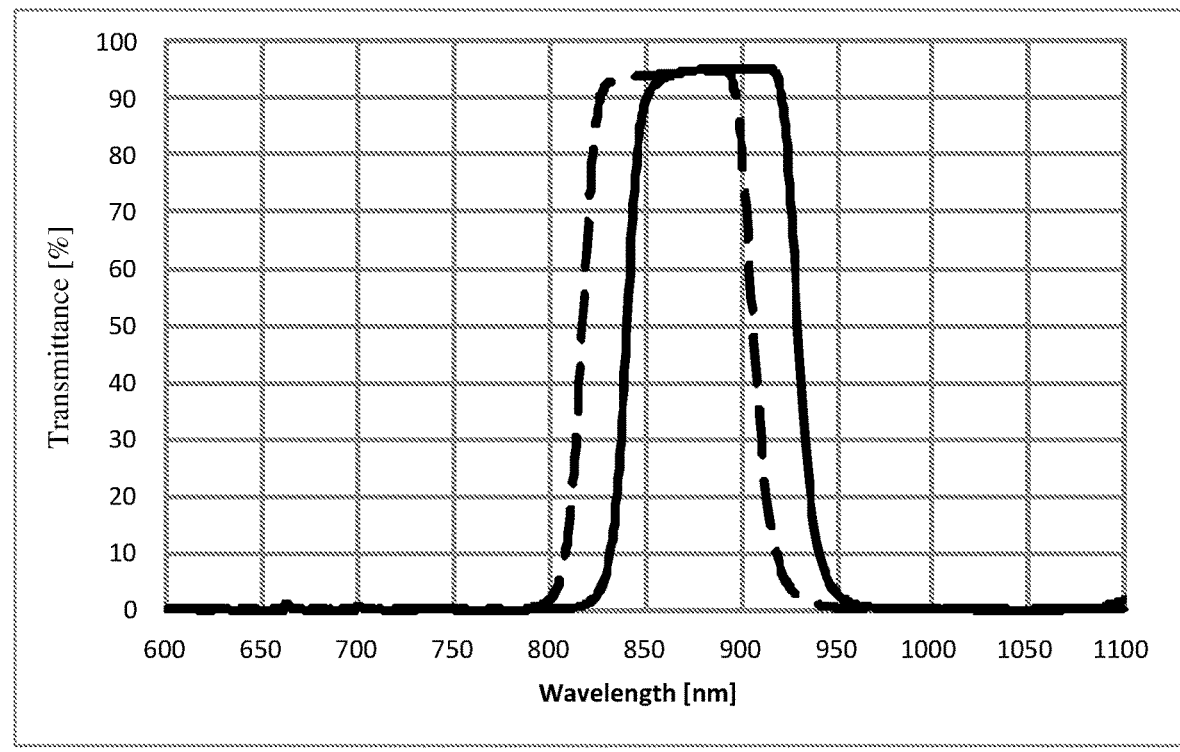
FIG. 5a shows the layer structure of a secondary bandpass filter for an optical filter according to the invention.
FIG. 5b shows the transmittance of the secondary bandpass filter according to FIG. 5a to glass and without an antireflection coating on the rear side of the glass at incidence angles of 0° (solid line) and 30° (dashed line).

FIG. 5a shows the layer structure of a secondary bandpass filter which has been optimized for transmittance at about 850-920 nm. The first layer is located on the substrate and the layer thicknesses are indicated in nanometres. The high refractive index material is aSi:H, prepared as described above (see FIG. 3a), the low refractive index material is SiO$_2$ with a refractive index of approximately 1.47 at 800 nm. The basic structure consists of aSi:H cavities (m=1) and mirror layers consisting of alternating high-refractive and low-refractive index layers and layer thicknesses, wherein the layer thicknesses were optimized with Filmstar. The SiO$_2$ layers are partially very thick, but the formulas given above provide good values. The angle shift of 23.4 nm from 0° to 30° is relatively large. Thanks to the formulas (1) and (2), the effective refractive index $n_S^*$ can be calculated to be 2.29 and with this value the angle shift up to 30° can be calculated to be 2.4% or 21.4 nm. The total layer thickness is about 2940 nm. FIG. 5b shows the transmittance of the secondary bandpass filter without antireflection coating on the rear side of the glass at incidence angles of 0° (solid line) and 30° (dashed line). For wavelengths shorter than approximately 600 nm, the transmittance is completely suppressed by absorption in aSi:H. The blocking is very good for all other wavelength ranges close to the bandpass filter, since the material combination with $n_{SL}$≈0.41 $n_{SH}$ allows very good blocking because of the large difference between the two refractive indices. Of course, other designs are possible for the secondary bandpass filter, which have, for example, less angle shift, steeper edges or even better blocking in the blocking area.

Figure 6:
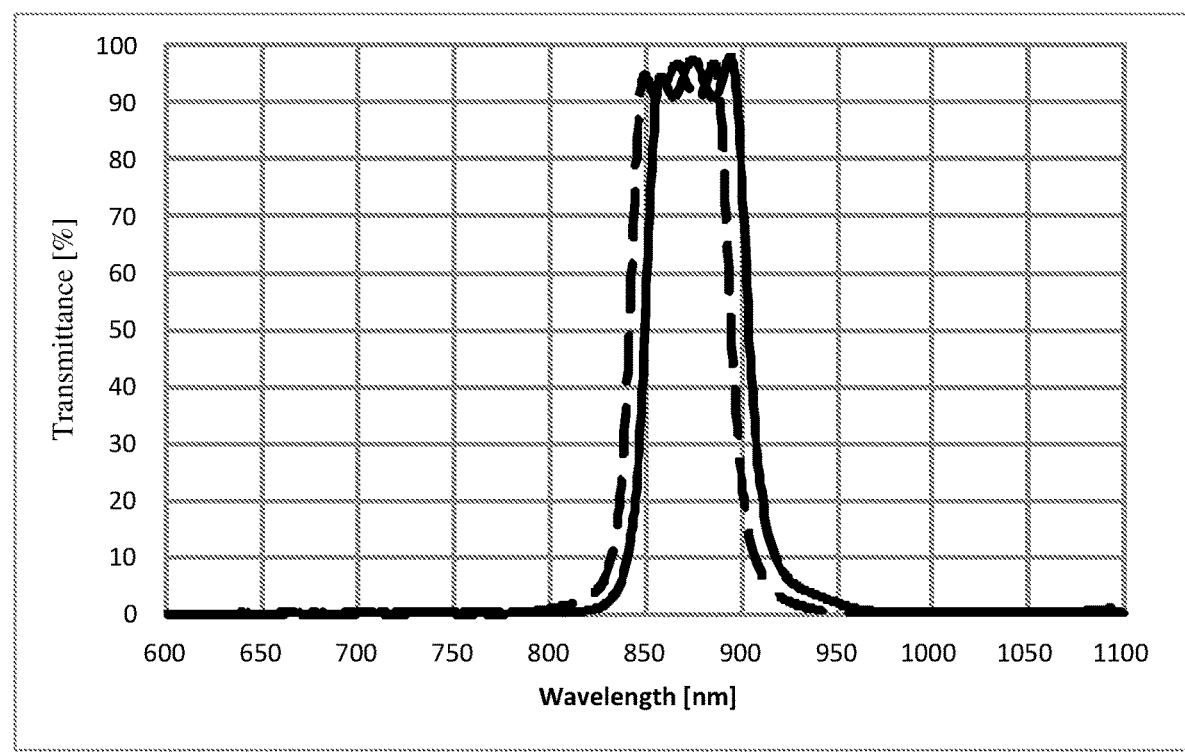
FIG. 6 shows the transmittance of a system consisting of the primary bandpass filter from FIG. 4a on the one side of a glass substrate in combination with the secondary bandpass filter of FIG. 5a on the other side of the glass substrate at incidence angles of 0° (solid line) and 30° (dashed line).

FIG. 6 shows the transmittance at incidence angles of 0° (solid line) and 30° (dashed line) of a primary bandpass filter system of FIG. 4a/b on the one side of a glass substrate in combination with the secondary bandpass filter of FIG. 5a/b on the other side of the glass substrate. The small angle shift for the angle range of 0° to 30° is defined by the primary bandpass filter, while the blocking in the spectral range outside the transmittance wavelength interval of the primary bandpass filter is achieved by blocking the secondary bandpass filter. The angle shift of the secondary band pass filter of 23.4 nm is sufficiently low, since, according to formula (3), $n_s^*$ must be above 1.74, which is well met.

If desired, in the case of the primary bandpass filter, the final layer can also be made of a purely oxidic material such as SiO$_2$. The advantage is that the oxidic material is chemically very stable and increases the environmental stability of the primary bandpass filter. FIG. 7 shows the layer structure of a primary bandpass filter which has been optimized for transmittance at approximately 860-900 nm. The basic structure is similar to the design of FIG. 4a, wherein a SiO$_2$ final layer with a layer thickness of 50 nm was added and the other layer thicknesses were re-optimized with Filmstar. The first layer is located on the substrate and the layer thicknesses are indicated in nanometres. The total layer thickness is about 2530 nm. The spectral properties of this layer system are almost indistinguishable from the properties of the design of FIG. 4a/b and are therefore not shown. It is, of course, possible not only to make the final layer of a different material, such as SiO$_2$, but also to add other layers made of further materials. In addition to SiO$_2$, the use of Si$_3$N$_4$ as a layer material would be advantageously possible since this gas is already available in the coating system and only the process parameters have to be adjusted such that corresponding low-refractive index materials can be produced.

Figure 8A:
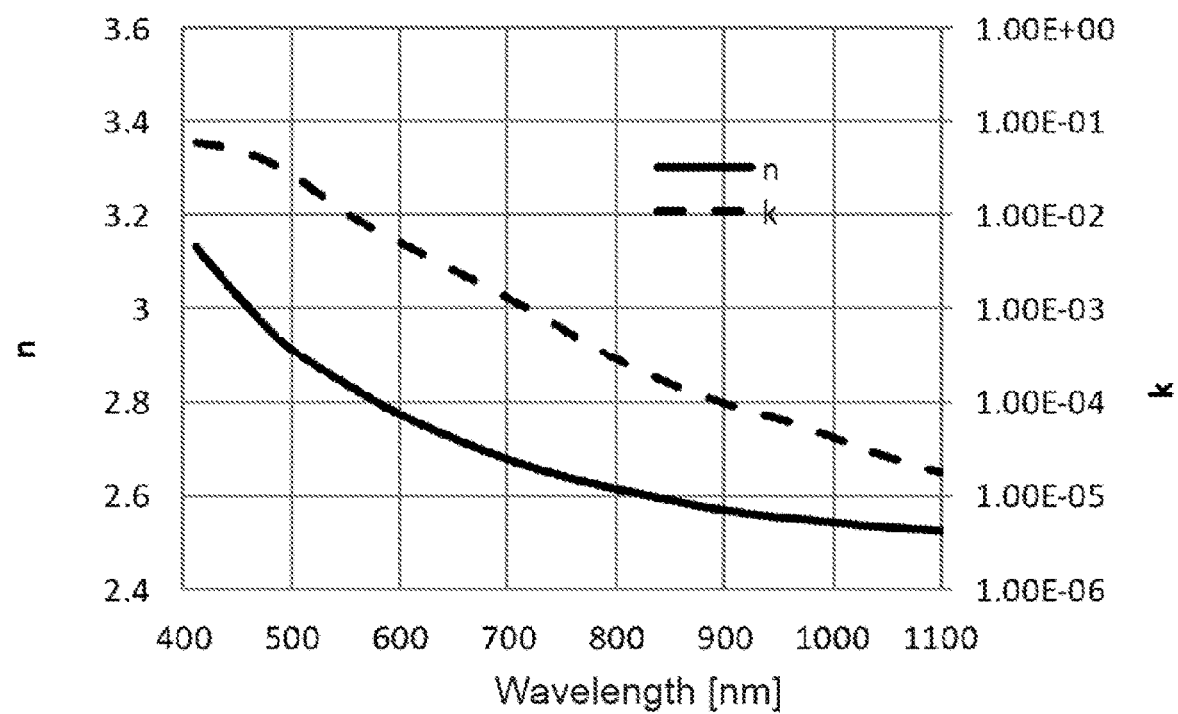
FIG. 8a shows the real part (n) and imaginary part (k) of the complex refractive index of an aSiN$_x$:H material produced according to a further method, wherein the refractive index was reduced to approximately 2.55 at a wavelength of 950 nm.

Small angle shifts and a spectral characteristic of the primary bandpass filter barely modified at very large angles such as 50° can also be achieved with thicker cavities and lower refractive index of the low-refractive index material. By increasing the nitrogen flow and the hydrogen flow (to reduce absorption) so that the gases Ar:N$_2$:H$_2$ are in the ratio 0.54:0.14:0.32, with the total flow being 180 sccm, the refractive index of the aSiN$_x$:H material was reduced to approximately 2.55 at a wavelength of 950 nm, see FIG. 8a. A primary bandpass filter was realized on the basis of the design from FIG. 2, but with increased cavity thicknesses {corresponding to m=3) and a further (fourth) cavity, wherein the layer thicknesses of the individual layers were re-optimized with Filmstar. FIG. 8b shows the layer structure of this primary bandpass filter which has been optimized for transmittance at approximately 930-970 nm. The first layer is located on the substrate and the layer thicknesses are indicated in nanometres. The total layer thickness is approximately 4100 nm. With the formulas (1) and (2) given above and the refractive indices of $n_{PH}$=3.52 and $n_{PL}$=2.55 at the center wavelength of 950 nm, $n_p^*$ is 3.15 (with m=3) and thus the angular shift up to 50° is 3.0% of the center wavelength or 29 nm. For the secondary bandpass filter, a material similar to the material of FIG. 3b was developed, but with a slight reduction in refractive index and increasing absorption in the spectral range of 600-800 nm.

Figure 8C:
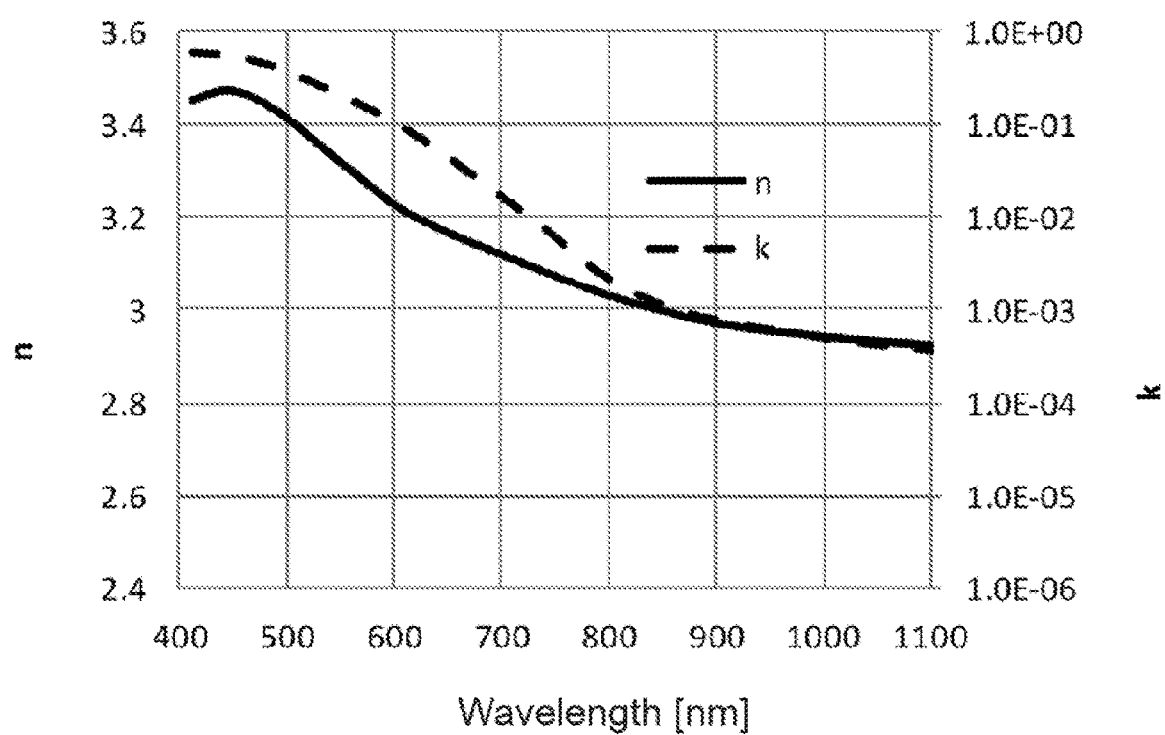
FIG. 8c shows the real part (n) and the imaginary part (k) of the complex refractive index of an aSiN$_x$:H material produced according to a further method, wherein the refractive index was reduced to approximately 2.95 at a wavelength of 950 nm.
Figure 8E:
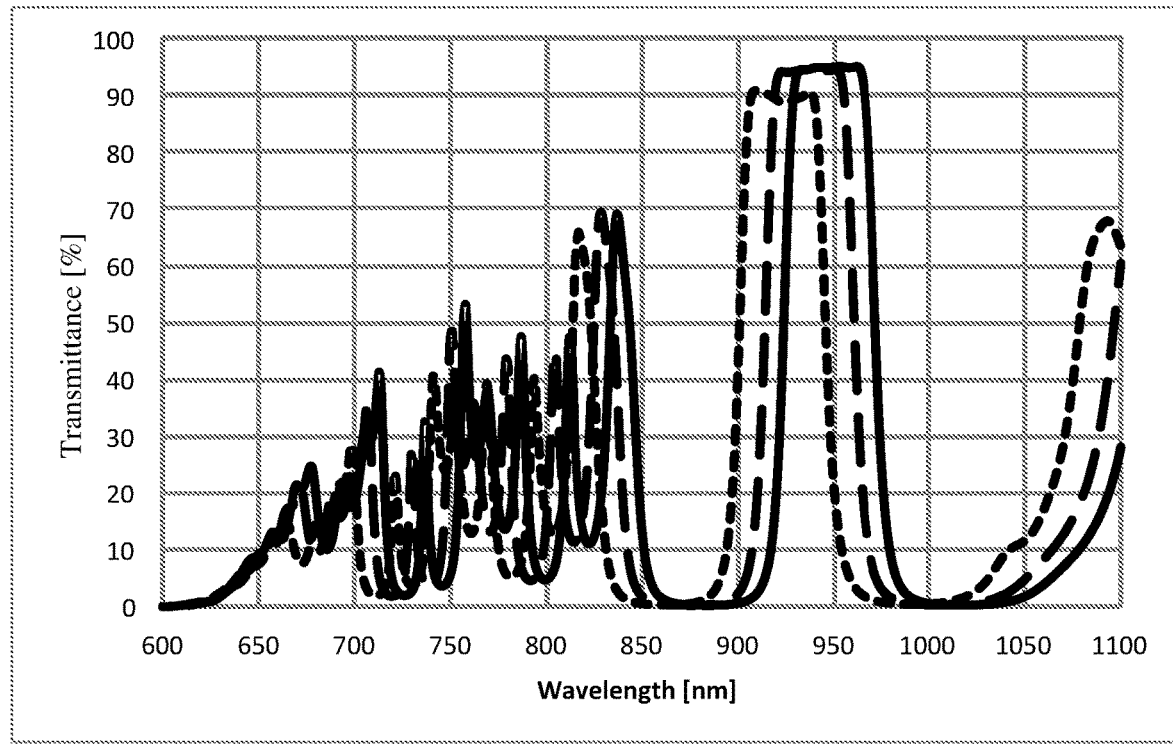
FIG. 8e shows the transmittance of the primary bandpass filter according to FIG. 8b to glass and without an antireflection coating on the rear side of the glass at incidence angles of 0° (solid line), 30° (dashed line) and 50° (dotted line).
Figure 8F:
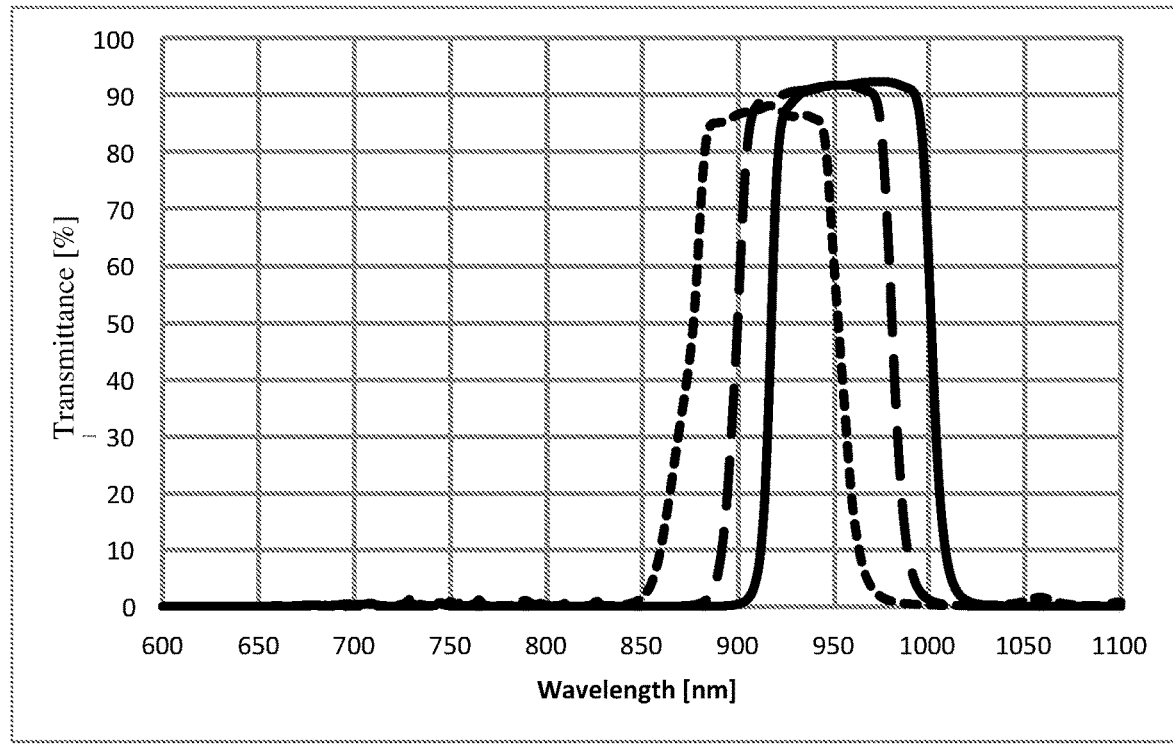
FIG. 8f shows the transmittance of the secondary bandpass filter according to FIG. 8d to glass and without an anti-reflection coating on the rear side of the glass at incidence angles of 0° (solid line), 30° (dashed line) and 50° (dotted line).
Figure 8G:
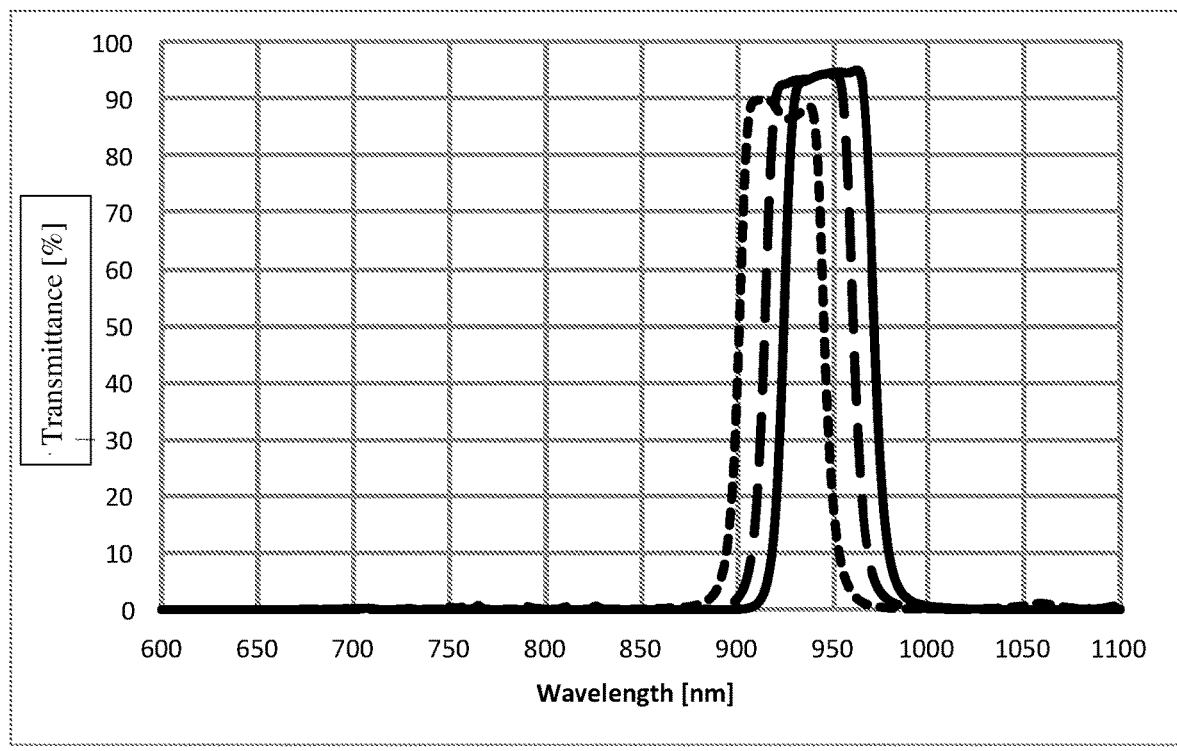
FIG. 8g shows the transmittance of a system consisting of the primary bandpass filter of FIG. 8b on the one side of a glass substrate in combination with the secondary bandpass filter of FIG. 8d on the other side of the glass substrate at incidence angles of 0° (solid line), 30° (dashed line) and 50° (dotted line).

Compared to the gas flows in the production of aSi:H, the nitrogen flow was increased and the hydrogen flow was kept constant, so that the gases Ar:N$_2$:H$_2$ are in the ratio 0.67: 0.13:0.2, wherein the total flow is 150 sccm, so that a relatively low n$_{SH}$ of approximately 2.95 has been achieved at 950 nm, see FIG. 8c. FIG. 8d shows the layer structure of a secondary bandpass filter which has been optimized for transmittance at approximately 930-990 nm. The first layer is located on the substrate and the layer thicknesses are indicated in nanometres. The low-refractive index material is again SiO$_2$ with a refractive index of approximately 1.47 at 950 nm and thus has a large difference in refractive index compared to the high-refractive index material. The total layer thickness is about 4600 nm. FIG. 8 e, f, g show in each case the transmittance of the primary bandpass filter, the transmittance of the secondary bandpass filter and the transmittance of the overall system with the primary bandpass filter on the one side and the secondary bandpass filter on the other side of the glass substrate at incidence angles of 0° (solid line), 30° (dashed line) and 50° (dotted line). The angle shift, here defined as the averaged difference between the short-wave and long-wave 50% points for the respective angles, is 9 nm up to 30° and 25 nm up to 50°, in each case from the properties at incidence angle of 0°, which is in good agreement with the values determined in formulas (1) and (2). According to the formulas (1) and (2), the angle shift of the secondary bandpass filter of 49 nm up to 50° is sufficiently low since, according to formula (3), n$_s$* must be above 2.22, which is satisfied with a n$_s$* of 2.41.

Figure 9B:
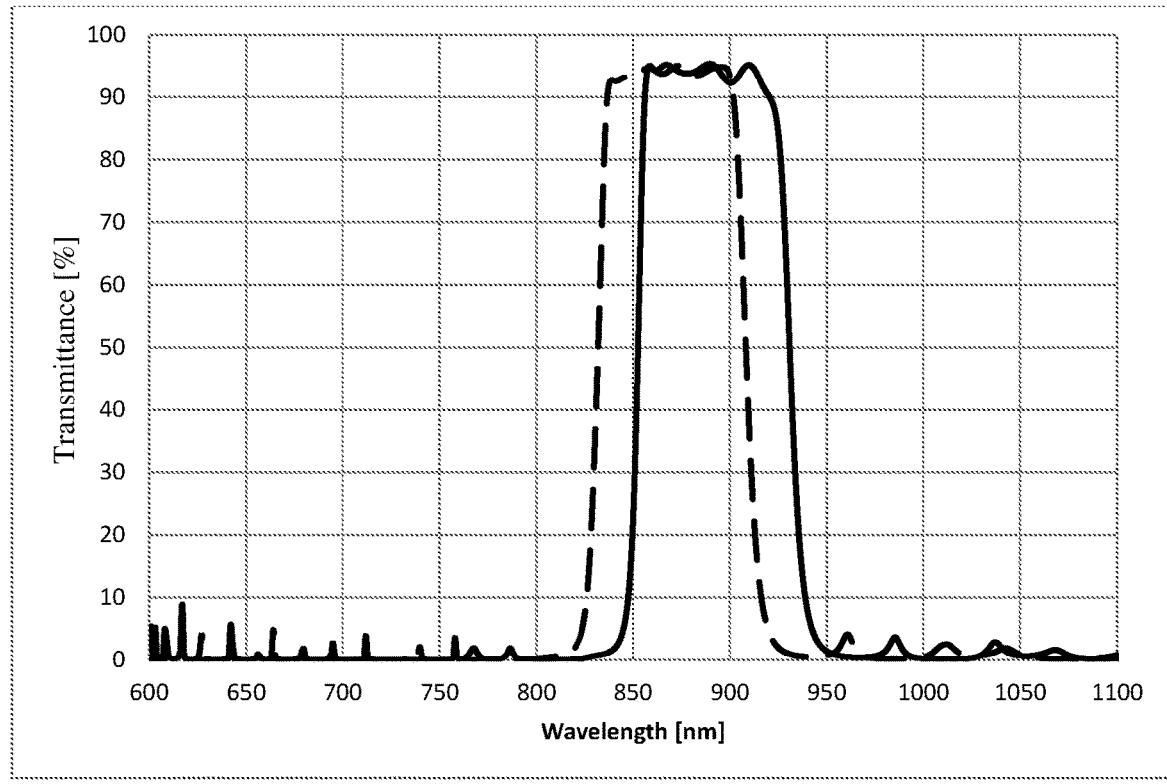
FIG. 9b shows the transmittance of the secondary bandpass filter of FIG. 9a to glass and without an anti-reflection coating on the rear side of the glass at incidence angles of 0° (solid line) and 25° (dashed line).
Figure 9C:
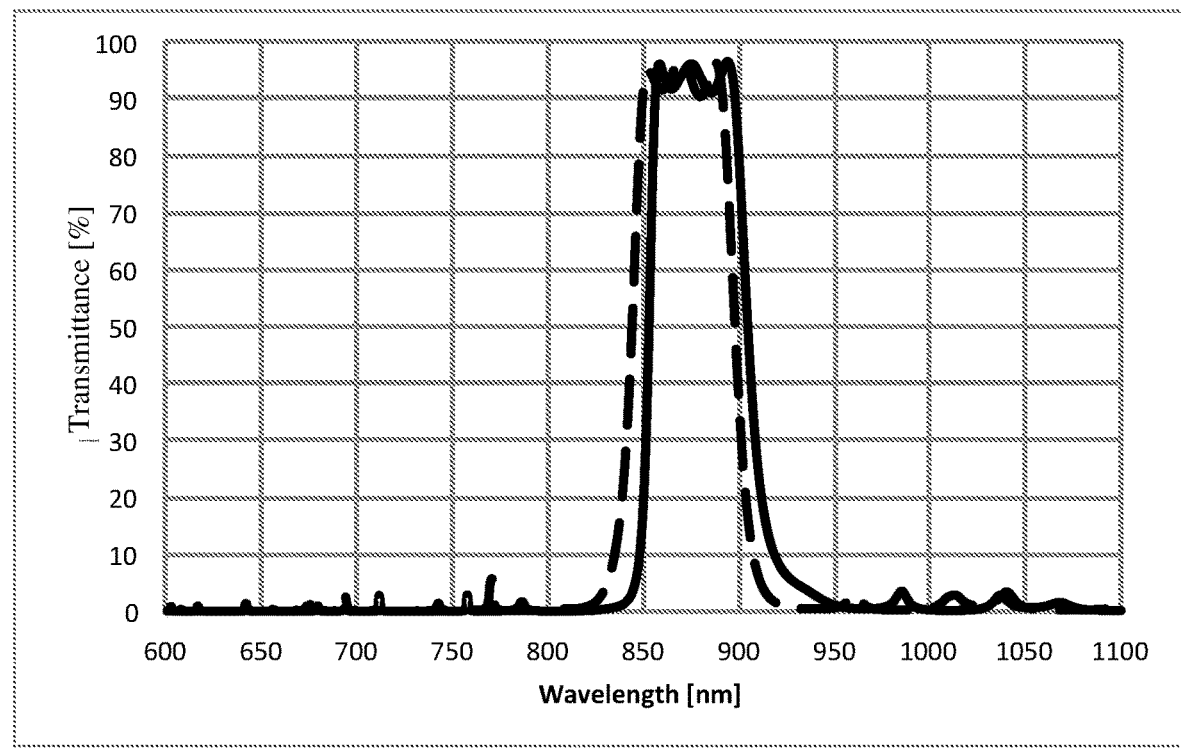
FIG. 9c shows the transmittance of a system consisting of the primary bandpass filter of FIG. 4a on the one side of a glass substrate in combination with the secondary bandpass filter of FIG. 9a on the other side of the glass substrate at incidence angles of 0° (solid line) and 25° (dashed line).

The secondary bandpass filter can also be produced with materials having even a lower refractive index. FIG. 9a shows the layer structure of a secondary bandpass filter which has been optimized for transmittance at approximately 855-925 nm. The first layer is located on the substrate and the layer thicknesses are indicated in nanometres; in the third column, the layer system is continued. The high refractive index material is Nb$_2$O$_5$, the low refractive index material is SiO$_2$ with a refractive index of approximately 1.47 at 800 nm. The basic structure consists of six Nb$_2$O$_5$ cavities and mirror layers of alternating high-refractive and low-refractive index layers, wherein the layer thicknesses were optimized with Filmstar. Since the high-refractive index material Nb$_2$O$_5$ has a refractive index of only approximately 2.25 at a wavelength of 890 nm, n$_s$* is only 1.91 at m=2. The angle shift of 22 nm from 0° to 25° determined by the formulas (1) and (2) is relatively large. The total layer thickness is about 8380 nm, that is a multiple of the secondary bandpass filter of FIG. 5a/b, because the difference between the refractive indices is relatively small and n$_{SL}$=0.65 n$_{SH}$ and thus the blocking is more difficult to achieve. FIG. 9b shows the transmittance of the secondary bandpass filter without anti-reflection coating on the rear side of the glass at incidence angles of 0° (solid line) and 25° (dashed line). The blocking has been optimized in the short-wave spectral range from approximately 830 nm to 600 nm, as the primary bandpass filter has sufficient blocking by absorption below 600 nm. FIG. 9c shows the transmittance at incidence angles of 0° (solid line) and 25° (dashed line) of a primary bandpass filter system of FIG. 4a/b on the one side of a glass substrate in combination with the secondary bandpass filter of FIG. 9a/b on the other side of the glass substrate. The small angle shift of 7.7 nm for the angle range from 0° to 25° is defined by the primary bandpass filter. It is difficult to cover a larger angle range because, due to the large angle shift of the Nb$_2$O$_5$-based secondary bandpass filter, the blocking range of the secondary bandpass filter travels into the transmittance wavelength interval. According to formula (3), the secondary blocker must have an n$_s$*>1.53, which is true. This shows that a secondary bandpass filter based on materials with a lower refractive index is possible, but better results can be achieved with a material having a higher refractive index.

Figure 10B:
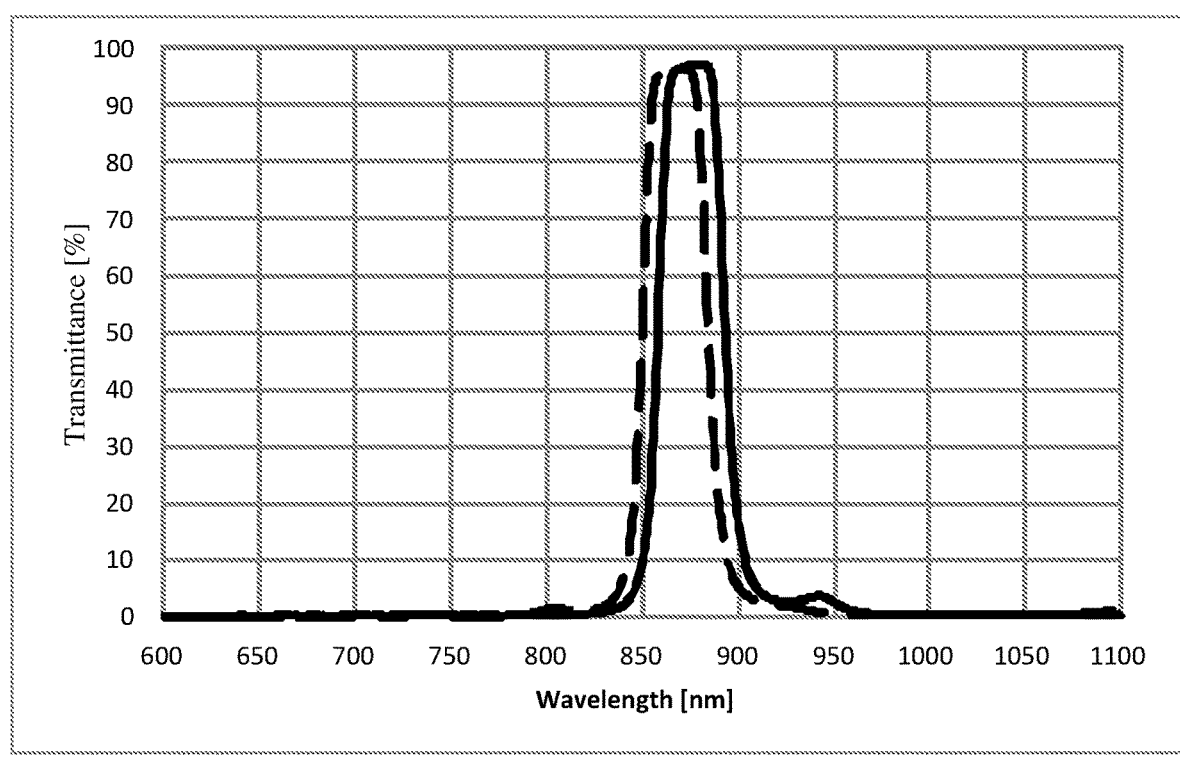
FIG. 10b shows the transmittance of a system consisting of the primary bandpass filter of FIG. 10a on the one side of a glass substrate in combination with the secondary bandpass filter of FIG. 5a on the other side of the glass substrate at incidence angles of 0° (solid line) and 30° (dashed line).

Bandpass filters with a different bandwidth are also possible by adapting the bandwidths of the primary bandpass filter and, if appropriate, of the secondary bandpass filter to the properties required in each case. FIG. 10a shows the layer structure of an example of a primary bandpass filter with reduced bandwidth, which has been optimized for transmittance at approximately 865-890 nm. The first layer is located on the substrate and the layer thicknesses are indicated in nanometres. In comparison with the layer system from FIG. 4 a/b, the number of mirror layers has been increased by incorporating the bold-printed layers 3 times in each case into the design. Furthermore, no optimization of the layer thicknesses was made. The total layer thickness is approximately 3010 nm. FIG. 10b shows the transmittance of this primary bandpass filter on the one side and the secondary bandpass filter of FIG. 5a/b on the other side of the glass substrate at incidence angles of 0° (solid line) and 30° (dashed line). Of course, the properties of the layer system could be further optimized with Filmstar to reduce, for example, the slight increase in transmittance at approximately 940 nm for the incidence angle of 0°. The angle shift, defined here as the average difference between the short-wave and the long-wave 50% points for the corresponding angles, is again 8.6 nm up to 30° and the same statements apply to the refractive indices of the two bandpass filters as in the example shown in FIGS. 4 and 5.

The average transmittance in the blocking range is 1% or less. In this case, the blocking range is defined as the spectral range which reaches from U to 20 nm of the short-wave 50% point of transmittance as well as the spectral range from 20 nm above the long-wave 50% point of the transmittance to V. In this case, U is maximum 480 nm, preferably U is maximum 420 nm and particularly preferably U is 300 nm. In addition, V is at least 980 nm, preferably at least 1050 nm and particularly preferably V is 1100 nm.

An advantage of the system design with double-sided coating is the possibility of stress compensation. In many cases, a coating on relatively large substrates (200 mm edge length or diameter or larger) is necessary. For many sensor applications, a thin substrate is necessary, for example, to keep the height of the sensor in applications for cameras in mobile telephony low. The layer thicknesses which are still relatively large can easily lead to bends of 5 mm and more in these substrates. If the layer systems are designed such that the layer stress is approximately the same on both sides, the bending of the substrate is minimized by stress compensation.

Figure 11B:
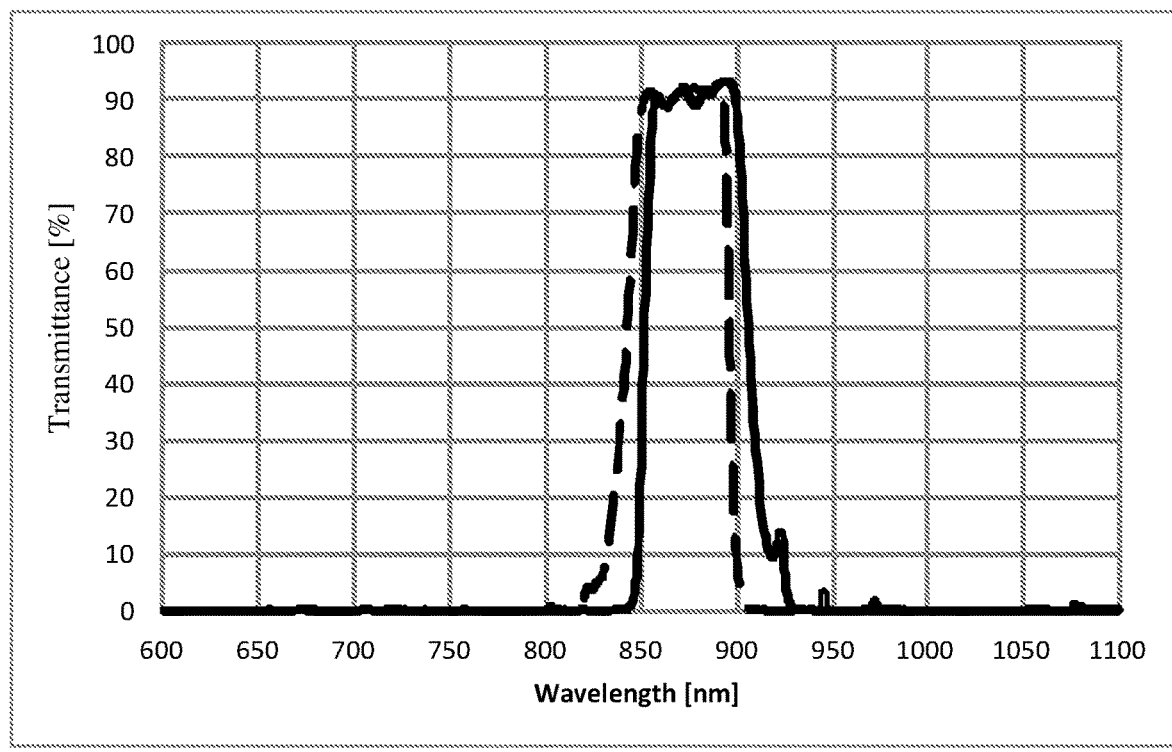
FIG. 11b shows the transmittance of the layer system of FIG. 11a to glass and without an anti-reflection coating on the rear side of the glass at incidence angles of 0° (solid line) and 30° (dashed line).

In some applications, however, it may be required that the layer system must be completely coated on one side of the substrate. For example, in some applications it is required that the coating be deposited directly on the sensor element. The approach of using a primary and a secondary bandpass filter is also possible in this case, but it complicates the situation because all layers of both bandpass filters can interact by interference. Nevertheless, it is possible to develop layer designs on the basis of the ideas described above, which designs have very good spectral properties and very small angle shift. FIG. 11a shows the layer structure of an example of a primary bandpass filter in combination with a secondary bandpass filter, which are all located on one side of the substrate. The first layer is located on the substrate and the layer thicknesses are indicated in nanometres, in the third and fourth column, the layer system is continued with a change from aSiN$_x$:H of FIG. 3b to SiO$_2$ as low-refractive index material. All layer thicknesses were readjusted with Filmstar. In comparison to the layer system of FIG. 4a/b, the proportion of the layer system corresponding to the primary bandpass filter has very similar layer thicknesses. In comparison to FIG. 5a/b, the proportion of the layer system corresponding to the secondary bandpass filter has very similar layer thicknesses, but in this case the number of cavities has been increased to five. The total layer thickness is approximately 7920 nm. FIG. 11b shows the transmittance of this layer system without anti-reflection coating on the other side of a glass at incidence angles of 0° (solid line) and 30° (dashed line). The angle shift, defined here as the averaged difference between the short-wave and the long-wave 50% points for the corresponding angles, is again only 9.3 nm up to 30° and the same statements apply to the refractive indices of the two bandpass filters as in the example of FIGS. 4 and 5.

For the person skilled in the art, it is obvious that, in addition to the examples shown, many designs are possible and solve the problem as described in the context of the invention. For example, the wavelength of the bandpass filter may be shifted, the steepness of the edges increased by increasing the number of cavities, or the width of the bandpass filter varied by changing the number of mirror layers. Moreover, design programs available today allow for the realization of designs whose layer thicknesses are not selected on the basis of the H and L layers described above. Nevertheless, the inventive concept of the primary and secondary bandpass filter as well as of the effective refractive index (then based on formula 2a) can also be used in this regard.

Different applications have been mentioned in the first sections of the present description. The optical filters according to the invention can be used advantageously in these applications. Corresponding applications which use the filters are, of course, again to be classified as inventive.

An optical filter has been described with a substrate on which a primary and a secondary bandpass filter is provided,
wherein the primary bandpass filter is based at least also and preferably predominantly on the interference principle of a primary alternating layer system, and in the primary alternating layer system layers made of a material $M_{PL}$ with the refractive index $n_{PL}$ alternate with layers consisting of another material $M_{PH}$ with the refractive index $n_{PH}$, wherein for the center wavelength of the primary bandpass filter $$n_{min} \leq n_{PL} < n_{PH},$$

wherein $n_{min}$ is 2.5, preferably 2.8 and particularly preferably 3.0 and
the effective refractive index $n_p^*$ of the primary bandpass filter is at least 3.1, preferably at least 3.2 and particularly preferably at least 3.3,
wherein the primary bandpass filter is constructed such that for each incidence angle of the electromagnetic radiation from 0° to φ, with φ being at least 20°, its spectral characteristic comprises a primary transmittance wavelength interval, in which the primary bandpass filter largely transmits the electromagnetic radiation and primary reflection wavelength intervals in which the primary bandpass filter reflects at least 70% of the electromagnetic radiation follow on both the short-wave and the long-wave side of the primary transmittance wavelength interval, and the secondary bandpass filter is based at least also and preferably predominantly on the interference principle of a secondary alternating layer system and in the secondary alternating layer system layers made of a material $M_{SL}$ with the refractive index $n_{SL}$ alternate with layers made of another material $M_{SH}$ with the refractive index $n_{SH}$, wherein for the effective refractive index of the secondary bandpass filter for the center wavelength of the secondary bandpass filter $$n_p^* > n_s^* \geq \frac{n_p^* \sin\varphi}{\sqrt{(\sin\varphi)^2 + 0.06 n_p^{*2}}}$$

and further 1.35<$n_{SL}$<0.66 $n_{SH}$<$n_{SH}$<4.1 and
wherein the secondary bandpass filter is constructed such that for each incidence angle of the electromagnetic radiation from 0° to φ its spectral characteristic comprises a secondary transmittance wavelength interval in which the secondary bandpass filter largely transmits the electromagnetic radiation and secondary reflection wavelength intervals in which the secondary bandpass filter largely reflects and/or absorbs the electromagnetic radiation follow on both the short-wave and long-wave side of the secondary transmittance wavelength interval, wherein the secondary transmittance wavelength interval completely comprises the primary transmittance wavelength interval and, for each incidence angle of the electromagnetic radiation on the substrate from 0° to φ, the transitions from the secondary transmittance wavelength interval to the secondary reflection wavelength intervals are in each case within the primary reflection wavelength intervals.

According to one embodiment, φ can be at least 30°, preferably at least 40° and particularly preferably at least 50°.

$N_{PH}$ may be equal to $n_{SH}$ and preferably $M_{PH}$ is equal to $M_{SH}$.

$M_{PH}$ may be hydrogenous amorphous silicon (aSi:H).

$M_{PL}$ may be amorphous silicon (aSi:H) in which nitrogen atoms and/or carbon atoms and/or oxygen atoms are admixed.

The primary bandpass filter may be arranged on a first surface of the substrate and the secondary bandpass filter may be arranged on the substrate surface opposite to the first surface.

Both primary and secondary bandpass filter can be realized on the same surface of the substrate, and an anti-reflection coating can preferably be provided on the substrate surface opposite this surface.

At the incidence angle of 0° the primary transmittance wavelength interval may be realized to be less than 50 nm wide.

At the incidence angle of 0° the primary transmittance wavelength interval may be realized to be more than 100 nm wide.

The optical filter may be constructed such that in the blocking range the averaged transmittance at the incidence angle of 0° is less than 1% and preferably lower.

The optical filter may be constructed such that in the range of the primary transmittance wavelength interval the averaged transmittance at the incidence angle of 0° is more than 80%, preferably more than 85% and particularly preferably more than 90%.

The optical filter may be constructed such that the primary transmittance wavelength interval at the incidence angle of 0° is at least partially in the spectral range of 800 nm to 1100 nm.

The optical filter may be constructed such that the filter has a small angle shift, preferably at incidence angles between 0° and 20° of less than 0.6%, more preferably less than 0.5% of the center wavelength of the bandpass filter and/or at incidence angles between 0° and 30° less than 1.2%, particularly preferably less than 1.0% of the center wavelength of the bandpass filter and/or at incidence angles between 0° and 50° less than 3.0%, particularly preferably less than 2.5% of the center wavelength of the bandpass filter.

A method has been presented for producing an optical filter having one or more or all of the above mentioned properties, wherein at least one of the materials from the group consisting of $M_{PS}$, $M_{PH}$, $M_{SL}$, and $M_{SH}$ is produced by magnetron sputtering, but preferably all are produced this way.

The method may be carried out by sputtering $M_{PS}$ and $M_{PH}$ from the same target, for the production of $M_{PS}$ nitrogen, oxygen and/or gas containing nitrogen, oxygen or carbon is introduced into the coating system during sputtering, wherein for the production of $M_{PH}$ less nitrogen, oxygen and/or gas containing nitrogen, oxygen or carbon and preferably no nitrogen, oxygen and/or gas containing nitrogen, oxygen or carbon is introduced.

What is claimed is:

1. Optical filter with a substrate on which a primary and a secondary bandpass filter is provided, wherein the primary bandpass filter is based at least on the interference principle of a primary alternating layer system, and in the primary alternating layer system layers made of a material $M_{PL}$ with the refractive index $n_{PL}$ alternate with layers made of another material $M_{PH}$ with the refractive index $n_{PH}$, wherein for the center wavelength of the primary bandpass filter $$n_{min} \leq n_{PL} < n_{PH},$$

wherein $n_{min}$ is at least above 2.5, and
   the effective refractive index $n_p^*$ of the primary bandpass filter is at least 3.1,
   wherein the primary bandpass filter is constructed such that for each incidence angle of the electromagnetic radiation from 0° to φ, with φ being at least 20°, its spectral characteristic comprises a primary transmittance wavelength interval, in which the primary bandpass filter largely transmits the electromagnetic radiation, and primary reflection wavelength intervals in which the primary bandpass filter reflects at least 70% of the electromagnetic radiation follow on both the short-wave and the long-wave side of the primary transmittance wavelength interval, and
   wherein the secondary bandpass filter is based at least on the interference principle of a secondary alternating layer system and in the secondary alternating layer system layers made of a material $M_{SL}$ with the refractive index $n_{SL}$ alternate with layers made of another material $M_{SH}$ with the refractive index $n_{SH}$, wherein for the effective refractive index of the secondary bandpass filter for the center wavelength of the secondary bandpass filter $$n_p^* > n_s^* \geq \frac{n_p^* \sin\varphi}{\sqrt{(\sin\varphi)^2 + 0.06 n_p^{*2}}}$$

and further $1.35 < n_{SL} < 0.66 \, n_{SH} < n_{SH} < 4.1$ and
   wherein the secondary bandpass filter is constructed such that for each incidence angle of the electromagnetic radiation from 0° to φ its spectral characteristic comprises a secondary transmittance wavelength interval in which the secondary bandpass filter largely transmits the electromagnetic radiation and secondary reflection wavelength intervals in which the secondary bandpass filter largely reflects and/or absorbs the electromagnetic radiation follow on both the short-wave and long-wave side of the secondary transmittance wavelength interval, wherein the secondary transmittance wavelength interval completely comprises the primary transmittance wavelength interval and, for each incidence angle of the electromagnetic radiation on the substrate from 0° to φ, the transitions from the secondary transmittance wavelength interval to the secondary reflection wavelength intervals are in each case within the primary reflection wavelength intervals.

2. Optical filter according to claim 1, characterized in that φ is at least 30°.

3. Optical filter according to claim 1, characterized in that $n_{PH}$ is equal to $n_{SH}$ and $M_{PH}$ is equal to $M_{SH}$.

4. Optical filter according to claim 1, characterized in that $M_{PH}$ is hydrogenous amorphous silicon (aSi:H).

5. Optical filter according to claim 1, characterized in that $M_{PL}$ is amorphous silicon (aSi:H) in which nitrogen atoms and/or carbon atoms and/or oxygen atoms are admixed.

6. Optical filter according to claim 1, characterized in that the primary bandpass filter is arranged on a first surface of the substrate and the secondary bandpass filter is arranged on the substrate surface opposite the first surface.

7. Optical filter according to claim 1, characterized in that both primary and secondary bandpass filter are realized on the same surface of the substrate and an anti-reflection coating is provided on the substrate surface opposite this surface.

8. Optical filter according to claim 1, characterized in that the primary transmittance wavelength interval is less than 50 nm wide at the incidence angle of 0°.

9. Optical filter according to claim 1, characterized in that the primary transmittance wavelength interval is more than 100 nm wide at the incidence angle of 0°.

10. Optical filter according to claim 1, characterized in that in the blocking range the averaged transmittance at the incidence angle of 0° is less than 1%.

11. Optical filter according to claim 1, characterized in that in the range of the primary transmittance wavelength interval, the averaged transmittance at the incidence angle of 0° is more than 80%.

12. Optical filter according to claim 1, characterized in that the primary transmittance wavelength interval at the incidence angle of 0° is at least partially in the spectral range of 800 nm to 1100 nm.

13. Optical filter according to claim 1, characterized in that the filter has a small angle shift, at incidence angles between 0° and 20°, of less than 0.6% of the center wavelength of the bandpass filter.

14. Method for producing an optical filter according to claim 1, characterized in that at least one of the materials from the group consisting of $M_{PL}$, $M_{PH}$, $M_{SL}$ and $M_{SH}$ is produced by means of magnetron sputtering.

15. Method according to claim 14, characterized in that $M_{PL}$ and $M_{PH}$ are sputtered from the same target, for the production of $M_{PL}$ nitrogen, oxygen and/or gas containing nitrogen, oxygen or carbon is introduced during sputtering into the coating system, wherein for the production of $M_{PH}$ less nitrogen, oxygen and/or gas containing nitrogen, oxygen or carbon.

16. Optical filter according to claim 1, wherein the primary bandpass filter is based predominantly on the interference principle of the primary alternating layer system and the secondary bandpass filter is based predominantly on the interference principle of the secondary alternating layer system.

17. Optical filter according to claim 1, wherein $n_{min}$ is above 2.8 and the effective refractive index $n_p^*$ of the primary bandpass filter is at least 3.2.

18. Optical filter according to claim 1, wherein $n_{min}$ is above 3.0 and the effective refractive index $n_p^*$ of the primary bandpass filter is at least 3.3.

19. Optical filter according to claim 1, characterized in that $\varphi$ is at least 40°.

20. Optical filter according to claim 1, characterized in that $\varphi$ is at least 50°.

* * * * *

UNITED STATES PATENT AND TRADEMARK OFFICE
CERTIFICATE OF CORRECTION

PATENT NO. : 11,022,733 B2
APPLICATION NO. : 16/614871
DATED : June 1, 2021
INVENTOR(S) : Thomas Eisenhammer It is certified that error appears in the above-identified patent and that said Letters Patent is hereby corrected as shown below:

In the Specification

Column 8, Line 12: please remove the phrase "index of $n_{PI} \leq 2.5$" and replace it with -- index of $n_{PI} \geq 2.5$ and --

Column 15, Line 18: please remove the phrase "consisting of $M_{PS}$" and replace it with -- consisting of $M_{PL}$, --

Column 15, Line 21: please remove the phrase "sputtering $M_{PS}$ and" and replace it with -- sputtering $M_{PL}$ and --

Column 15, Line 22: please remove the phrase "production of $M_{PS}$" and replace it with -- production of $M_{PL}$ --

In the Claims

Claim 15, Column 17, Line 9: please remove the phrase "or carbon" and replace it with -- or carbon is introduced --

Signed and Sealed this
Fifteenth Day of March, 2022

Drew Hirshfeld
*Performing the Functions and Duties of the*
*Under Secretary of Commerce for Intellectual Property and*
*Director of the United States Patent and Trademark Office*